United States Patent
Yano et al.

(10) Patent No.: US 9,823,315 B2
(45) Date of Patent: Nov. 21, 2017

(54) MAGNETIC SENSOR

(71) Applicant: DENSO CORPORATION, Kariya, Aichi-pref. (JP)

(72) Inventors: Toshifumi Yano, Obu (JP); Takamoto Furuichi, Nagoya (JP)

(73) Assignee: DENSO CORPORATION, Kariya (JP)

( * ) Notice: Subject to any disclaimer, the term of this patent is extended or adjusted under 35 U.S.C. 154(b) by 408 days.

(21) Appl. No.: 14/410,654

(22) PCT Filed: Jul. 3, 2013

(86) PCT No.: PCT/JP2013/004136
§ 371 (c)(1),
(2) Date: Dec. 23, 2014

(87) PCT Pub. No.: WO2014/006898
PCT Pub. Date: Jan. 9, 2014

(65) Prior Publication Data
US 2015/0145511 A1    May 28, 2015

(30) Foreign Application Priority Data

Jul. 5, 2012  (JP) .................. 2012-151499
Jun. 13, 2013 (JP) .................. 2013-124820

(51) Int. Cl.
*G01R 33/09* (2006.01)
*H01L 43/08* (2006.01)
*H01F 10/32* (2006.01)

(52) U.S. Cl.
CPC ........... *G01R 33/098* (2013.01); *G01R 33/09* (2013.01); *G01R 33/093* (2013.01);
(Continued)

(58) Field of Classification Search
CPC .. G01R 33/093; G01R 33/098; H01F 10/3295
See application file for complete search history.

(56) References Cited

U.S. PATENT DOCUMENTS 5,381,047 A * 1/1995 Kanno ................ H01L 23/13
                                                     257/618
5,477,482 A * 12/1995 Prinz ................. G11C 11/15
                                                     257/E27.005
(Continued)

FOREIGN PATENT DOCUMENTS

JP  2002-522917 A  7/2002
JP  2002-359415 A  12/2002

OTHER PUBLICATIONS

International Search Report and Written Opinion of the International Searching Authority dated Sep. 3, 2013 in the corresponding PCT application No. PCT/JP2013/004136 (and English translation).

(Continued)

*Primary Examiner* — Giovanni Astacio-Oquendo
*Assistant Examiner* — Alvaro Fortich
(74) *Attorney, Agent, or Firm* — Posz Law Group, PLC

(57) ABSTRACT

In a magnetic sensor, a pinned layer covers a wiring layer on a side opposite to a substrate with respect to the wiring layer and includes a bent portion having a bent shape in cross section. Free layers are arranged on a side opposite to the substrate with respect to the pinned layer. The size of the free layers in a planar direction is set to a size smaller than the size of the pinned layer in the planar direction. A magnetic field leaking from the pinned layer may form a closed loop adjacent to the substrate, that is, on a side opposite to the free layers with respect to the substrate. Therefore, influence of the magnetic field leaking from the pinned layer on the free layers can be restricted.

19 Claims, 21 Drawing Sheets

(52) U.S. Cl.
CPC ..... *H01F 10/3254* (2013.01); *H01F 10/3295* (2013.01); *H01L 43/08* (2013.01)

(56) References Cited

U.S. PATENT DOCUMENTS

| | | | |
|---|---|---|---|
| 6,351,410 B1 * | 2/2002 | Nakao | B82Y 25/00 257/E27.005 |
| 6,396,776 B1 | 5/2002 | Ueyanagi | |
| 6,577,526 B1 * | 6/2003 | Schwarzl | B82Y 25/00 257/E43.004 |
| 2002/0036873 A1 | 3/2002 | Hara et al. | |
| 2003/0006764 A1 | 1/2003 | Kou | |
| 2007/0001251 A1 * | 1/2007 | Saito | H01L 43/08 257/421 |
| 2010/0297475 A1 * | 11/2010 | Kawakami | H01L 43/08 428/811.1 |
| 2010/0327857 A1 | 12/2010 | Hoshiya et al. | |
| 2011/0025319 A1 * | 2/2011 | Saruki | G01R 33/0029 324/252 |
| 2011/0037459 A1 * | 2/2011 | Okada | G01D 5/145 324/207.25 |
| 2011/0156181 A1 * | 6/2011 | Takeuchi | B82Y 10/00 257/421 |
| 2012/0061779 A1 * | 3/2012 | Ohmori | H01L 43/10 257/421 |

OTHER PUBLICATIONS

Office Action dated Mar. 4, 2014 in the corresponding JP application No. 2013-124820 (and English translation).

* cited by examiner (a)

(b)

MAGNETIC SENSOR

CROSS REFERENCE TO RELATED APPLICATIONS

The present disclosure is a U.S. national stage application of PCT/JP2013/004136 filed on Jul. 3, 2013 and is based on Japanese Patent Application No. 2012-151499 filed on Jul. 5, 2012 and Japanese Patent Application No. 2013-124820 filed on Jun. 13, 2013, and the disclosures of which are incorporated herein by reference.

TECHNICAL FIELD

The present disclosure relates to a magnetic sensor for measuring an application direction of an external magnetic field.

BACKGROUND ART

Conventionally, a multilayer film magnetic device 1 such as a TMR element or a GMR element has been known. The multilayer film magnetic device 1 includes a free layer 1a having a magnetization direction Ha that changes according to an external magnetic field H, a pinned layer 1b in which a magnetization direction Hb is fixed, and an intermediate layer 1c which is inserted between the free layer 1a and the pinned layer 1b (see FIG. 27). In addition, the intermediate layer 1c is a tunnel film in a case of the TMR element, and the intermediate layer 1c is a non-magnetic film in a case of the GMR element.

Here, when the external magnetic field H is applied to the multilayer film magnetic device 1, a resistance value between the free layer 1a and the pinned layer 1b is changed due to a spin state of the free layer 1a and the pinned layer 1b. That is, the resistance value between the free layer 1a and the pinned layer 1b is changed due to the angle between the magnetization direction Ha of the free layer 1a and the magnetization direction Hb of the pinned layer 1b. Consequently, the application direction (application angle) of the external magnetic field H can be measured by measuring the current value flowing in the intermediate layer 1c between the free layer 1a and the pinned layer 1b.

In FIG. 27, when the magnetization direction Ha of the free layer 1a and the magnetization direction Hb of the pinned layer 1b face the opposite direction from each other, an application angle is zero degree. When the magnetization directions Ha and Hb face the same direction as each other, the application angle is +180 degrees or −180 degrees. The resistance value becomes the maximum when the application angle is 0 degree and the resistance value becomes the minimum when the application angle is +180 degrees and −180 degrees.

In the pinned layer 1b of the multilayer film magnetic device 1, since the magnetization direction needs to be fixed with respect to the external magnetic field H, it is necessary to select a material with high coercive force. However, for example, when a permanent magnet material such as NdFeB or SmCo is applied to the pinned layer 1b as it is, a magnetic field is leaked from a magnetic end surface due to magnetization polarization (see an arrow MR1 in FIG. 28). Since the magnetization direction Ha of the free layer 1a is shifted (for example, to a direction of a solid arrow Ha) from an ideal direction (a direction of a dashed arrow, that is, a direction of an external magnetic field H) when the leakage magnetic field affects the free layer 1a, a detection angle error is generated (see FIG. 28).

In order to avoid such an error, as shown in FIG. 29, a structure provided with an antiferromagnetic layer 3d and a laminated ferrimagnetic layer 2 is used for the pinned layer 1b in general (in a magnetic head or a magnetic sensor). The laminated ferrimagnetic layer 2 has a structure in which the non-magnetic film 3c is interposed between two magnetic films 3a and 3b. Accordingly, the laminated ferrimagnetic layer 2 is stabilized in a state in which the magnetization directions Hc1 and Hc2 of the magnetic films 3a and 3b are inverted by 180 degrees caused by magnetic exchanged interaction. The antiferromagnetic body 3d has an effect for fixing the magnetization of a film interface in one direction. In this manner, the coercive force is increased using two effects of the antiferromagnetic body 3d and the laminated ferrimagnetic layer 2, and the pinned layer 1b is stabilized with respect to the external magnetic field H. Further, it is known that the magnetic field leaked from the end surface of the laminated ferrimagnetic layer 2 is cancelled when two magnetic films 3a and 3b of the laminated ferrimagnetic layer 2 are adjusted to have the same level of magnetization (see an arrow MF2). Therefore, it is necessary to adjust film thicknesses of both of the films to be the same level by managing the film thicknesses of two magnetic films 3a and 3b.

However, the film thicknesses of the magnetic films 3a and 3b of the laminated ferrimagnetic layer 2 are respectively on the order of several nm, which is extremely thin. In addition, it is known that the film thickness of the non-magnetic film 3c is thinner and on the order of sub nm. Accordingly, as described above, adjustment of magnetization of the magnetic films 3b and 3c to be the same level by managing the film thicknesses of the magnetic films 3a and 3b and formation of the film thickness of the non-magnetic film 3c with excellent controllability are extremely difficult to realize in terms of process management.

PRIOR ART LITERATURE

Patent Literature

Patent Literature 1: JP 2009-180604 A

SUMMARY OF INVENTION

In light of the above-described issues, an object of the present disclosure is to provide a magnetic sensor in which influence of a magnetic field leaked from a magnetization fixed layer on a ferromagnetic layer is restricted by examining the shape of the magnetization fixed layer.

Solution to Problem

According to a first aspect of the present disclosure, a magnetic sensor includes: a magnetization fixed layer disposed adjacent to a surface of a substrate and having a magnetization direction that is fixed in a direction parallel to a planar direction of the substrate; a ferromagnetic layer disposed on a side opposite to the substrate with respect to the magnetization fixed layer and having a magnetization direction that changes according to an external magnetic field; and a non-magnetic intermediate layer interposed between the magnetization fixed layer and the ferromagnetic layer and having a resistance value that changes according to an angle between the magnetization direction of the magnetization fixed layer and the magnetization direction of the ferromagnetic layer. An application angle of the external magnetic field is measured based on a resistance value between the magnetization fixed layer and the ferromagnetic layer. The magnetization fixed layer includes a bent portion having a bent shape in cross section in which a first end portion and a second end portion of a flat portion, which defines a planar direction parallel to the planar direction of the substrate, are bent.

According to the above, the magnetization fixed layer includes the bent portion having the bent shape in cross section in which the first end portion and the second end portion of the flat portion in the planar direction are bent. For this reason, a magnetic field leaking from the magnetization fixed layer can form a closed loop excluding the ferromagnetic layer. Therefore, it is possible to restrict the influence of the magnetic field leaking from the magnetization fixed layer on the ferromagnetic layer.

According to a second aspect of the present disclosure, a magnetic sensor includes: a magnetization fixed layer disposed adjacent to a surface of a substrate and having a magnetization direction that is fixed in a direction parallel to a planar direction of the substrate; a ferromagnetic layer disposed on a side opposite to the substrate with respect to the magnetization fixed layer and having a magnetization direction that changes according to an external magnetic field; and a non-magnetic intermediate layer interposed between the magnetization fixed layer and the ferromagnetic layer and having a resistance value that changes according to an angle between the magnetization direction of the magnetization fixed layer and the magnetization direction of the ferromagnetic layer. An application angle of the external magnetic field is measured based on a resistance value between the magnetization fixed layer and the ferromagnetic layer. The magnetization fixed layer has a modified rectangular shape in cross section provided by modifying a rectangle having a first side and a second side opposed to each other to satisfy a relationship of La>Lb, in which La is a dimension between opposite ends of the first side and Lb is a dimension between opposite ends of the second side.

According to the above, the magnetization fixed layer has the modified rectangular shape in cross section provided by modifying the rectangle to satisfy the relationship of La>Lb in which Lb is the dimension between the opposite ends of the second side of the rectangle. For this reason, a magnetic field leaking from the magnetization fixed layer can form a closed loop excluding the ferromagnetic layer. Therefore, it is possible to restrict the influence of the magnetic field leaking from the magnetization fixed layer on the ferromagnetic layer.

According to a third aspect of the present disclosure, a magnetic sensor includes: a columnar base material; a magnetization fixed layer disposed on an outer peripheral side of the base material, having a ring shape in cross section, and having a magnetization direction fixed in a circumferential direction centering on an axis of the base material; a ferromagnetic layer disposed on an outer peripheral side of the magnetization fixed layer and having a magnetization direction that changes according to an external magnetic field; and a non-magnetic intermediate layer interposed between the magnetization fixed layer and the ferromagnetic layer and having a resistance value that changes according to an angle between the magnetization direction of the magnetization fixed layer and the magnetization direction of the ferromagnetic layer. An application angle of the external magnetic field is measured based on a resistance value between the magnetization fixed layer and the ferromagnetic layer.

According to the description above, the magnetization fixed layer has the ring shape in cross section. For this reason, a magnetic field can form a closed loop in the magnetization fixed layer. Therefore, it is possible to restrict the influence of the magnetic field leaking from the magnetization fixed layer on the ferromagnetic layer.

According to a fourth aspect of the present disclosure, a magnetic sensor includes: a cylindrical base material; a magnetization fixed layer disposed on an outer peripheral side of the base material, having a ring shape in cross section, and having a magnetization direction that is fixed in a circumferential direction centering on an axis of the base material; a ferromagnetic layer disposed on an outer peripheral side of the magnetization fixed layer and having a magnetization direction that changes according to an external magnetic field; and a non-magnetic intermediate layer interposed between the magnetization fixed layer and the ferromagnetic layer and having a resistance value that changes according to an angle between the magnetization direction of the magnetization fixed layer and the magnetization direction of the ferromagnetic layer. An application angle of the external magnetic field is measured based on a resistance value between the magnetization fixed layer and the ferromagnetic layer.

According to the above, the magnetization fixed layer has the ring shape in cross section. For this reason, a magnetic field can form a closed loop in the magnetization fixed layer. Therefore, it is possible to restrict the influence of the magnetic field leaking from the magnetization fixed layer on the ferromagnetic layer.

BRIEF DESCRIPTION OF DRAWINGS

The above and other objects, features and advantages of the present disclosure will become more apparent from the following detailed description made with reference to the accompanying drawings, in which.

(a) of FIG. 1 is a diagram illustrating a cross-sectional configuration of a magnetic sensor according to a first embodiment of the present disclosure, and (b) of FIG. 1 is a diagram illustrating an enlarged cross sectional view of an IB portion of (a) of FIG. 1.

Figure 5:
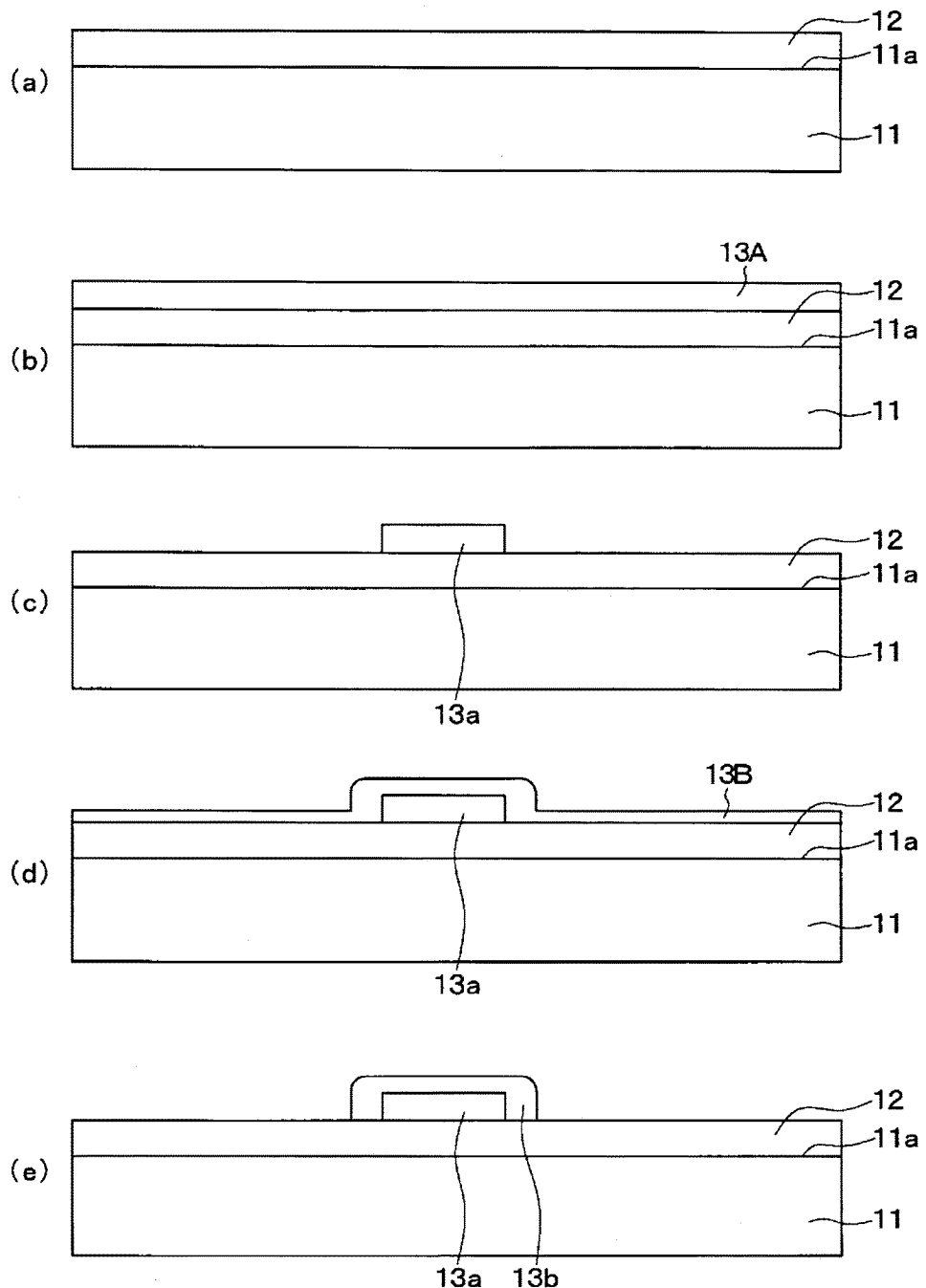

(a) to (e) of FIG. 5 are diagrams illustrating a process of producing the magnetic sensor according to the first embodiment.

Figure 6:
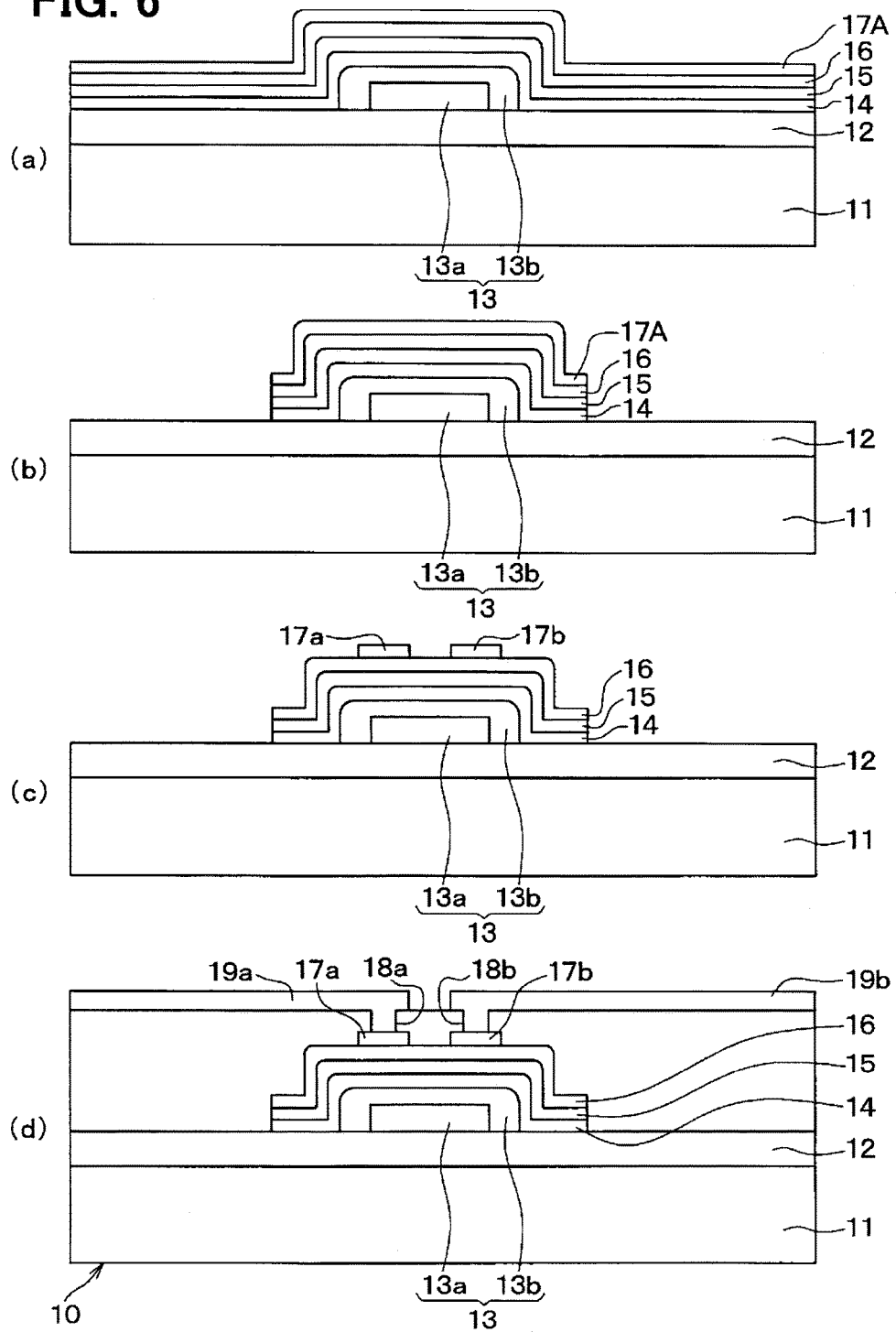

(a) to (d) of FIG. 6 are diagrams illustrating a process of producing the magnetic sensor according to the first embodiment.

Figure 7:
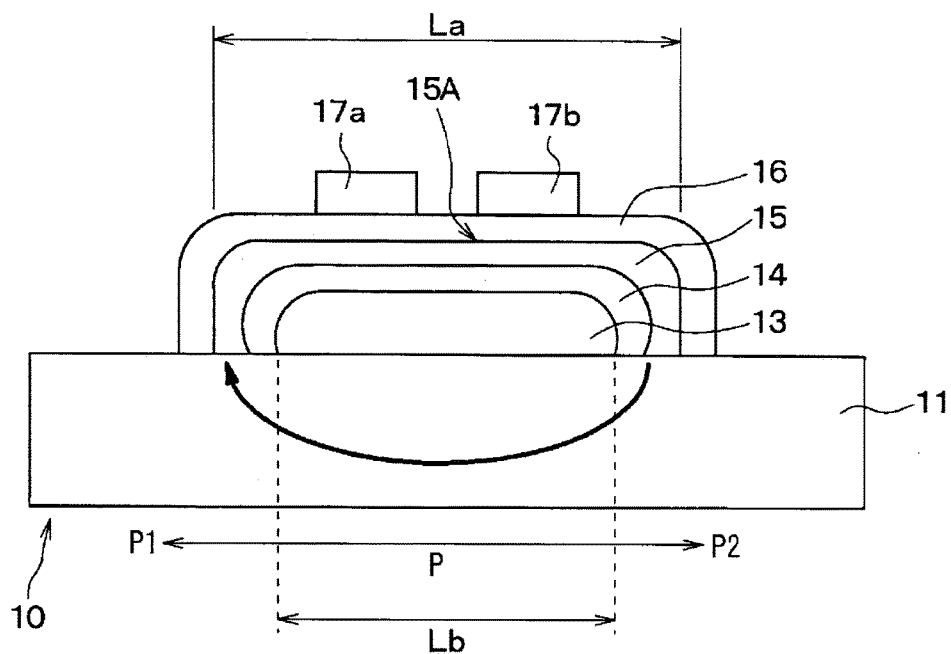

FIG. 7 is a diagram illustrating a cross-sectional configuration of a magnetic sensor according to a second embodiment of the present disclosure.

Figure 8:
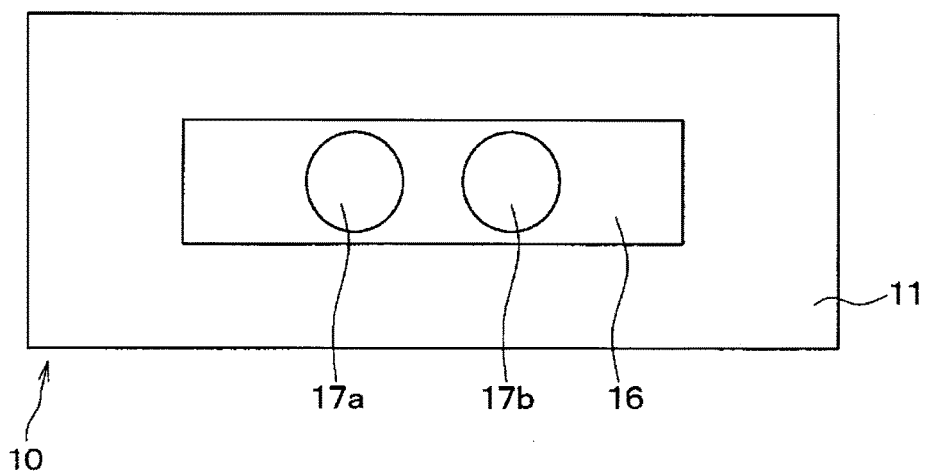

FIG. 8 is a diagram illustrating a plan view of the magnetic sensor according to the second embodiment.

Figure 9:
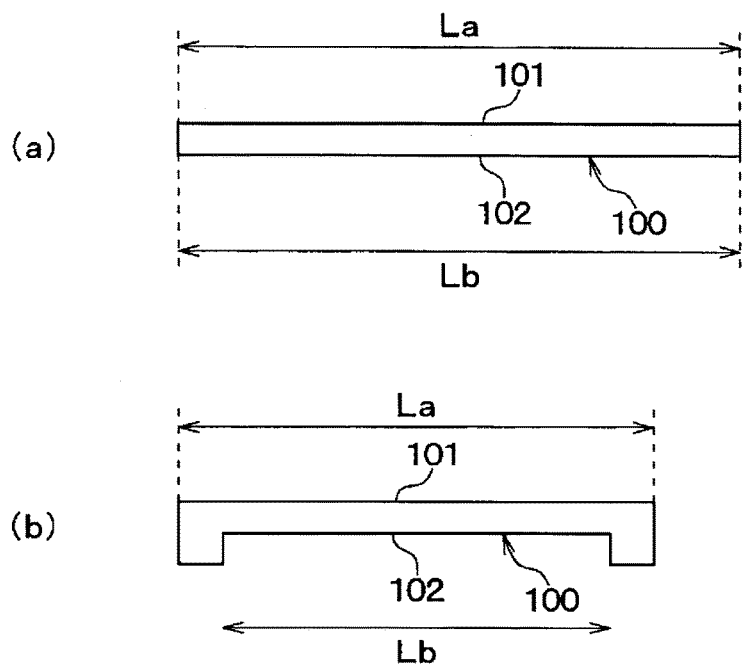

(a) and (b) of FIG. 9 are diagrams for explaining the cross-sectional shape of the magnetic sensor according to the second embodiment.

Figure 10:
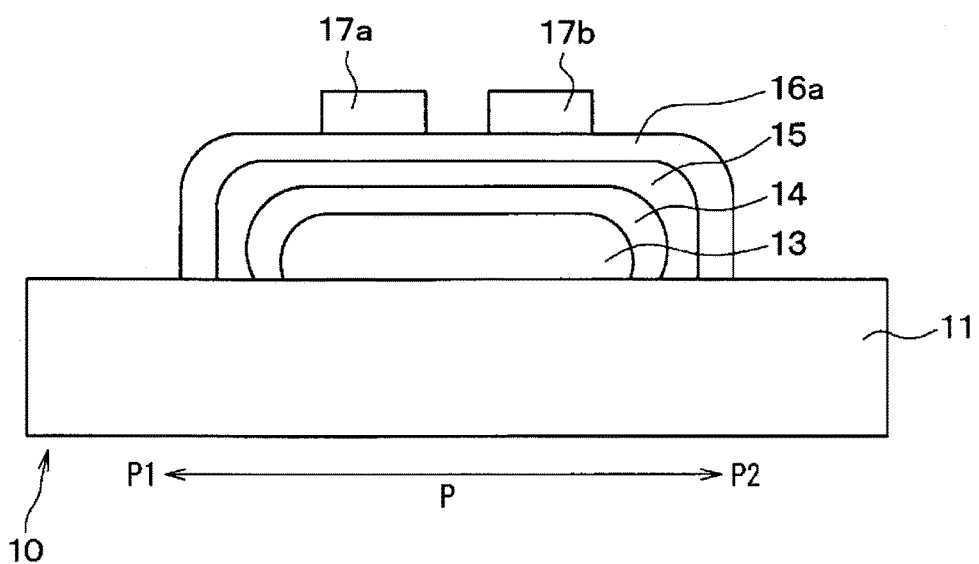

FIG. 10 is a diagram illustrating a cross-sectional configuration of a magnetic sensor according to a third embodiment of the present disclosure.

Figure 11:
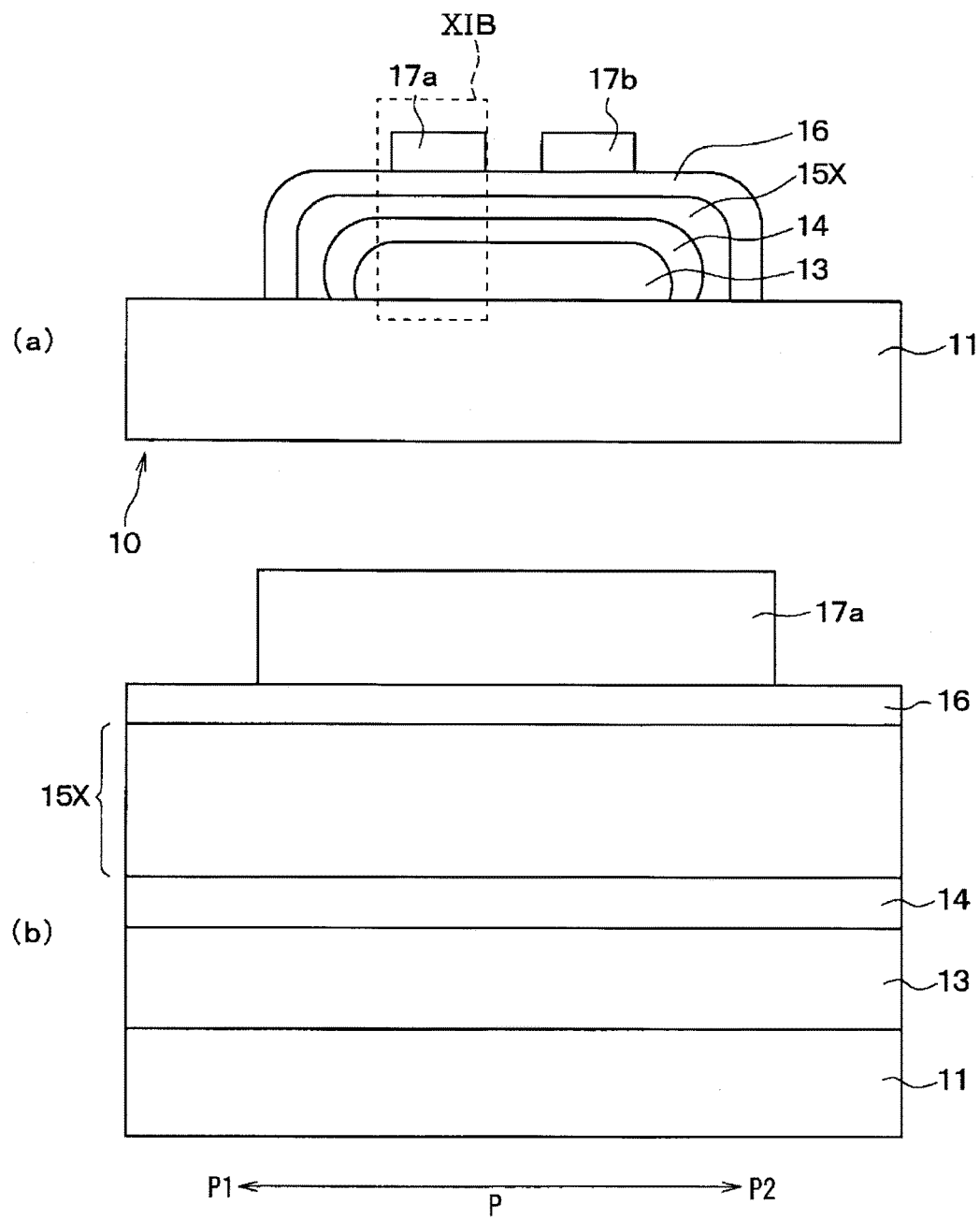

(a) of FIG. 11 is a diagram illustrating a cross-sectional configuration of a magnetic sensor according to a fourth embodiment of the present disclosure, and (b) of FIG. 11 is a diagram illustrating an enlarged cross section of an XIB portion of (a) of FIG. 11.

Figure 12:
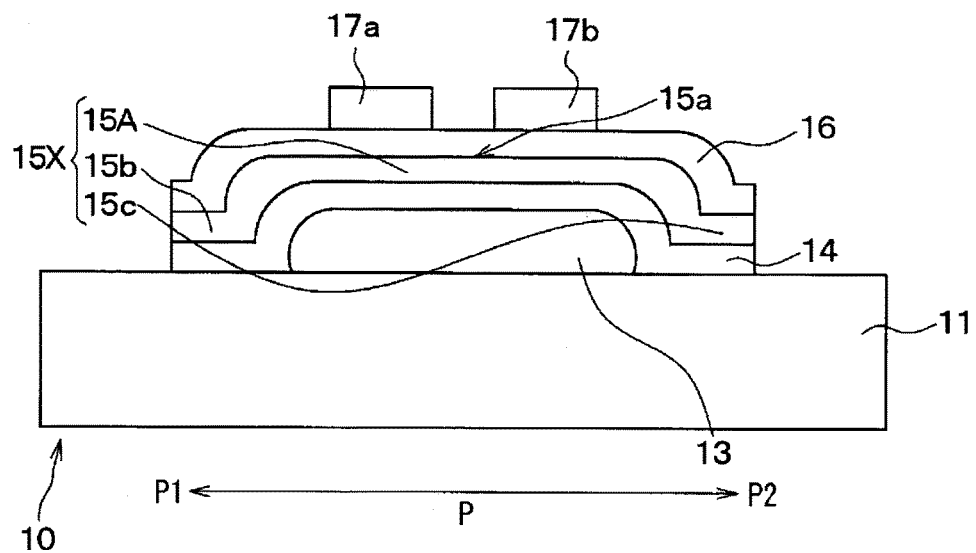

FIG. 12 is a diagram illustrating a cross-sectional configuration of a magnetic sensor according to a fifth embodiment of the present disclosure.

Figure 13:
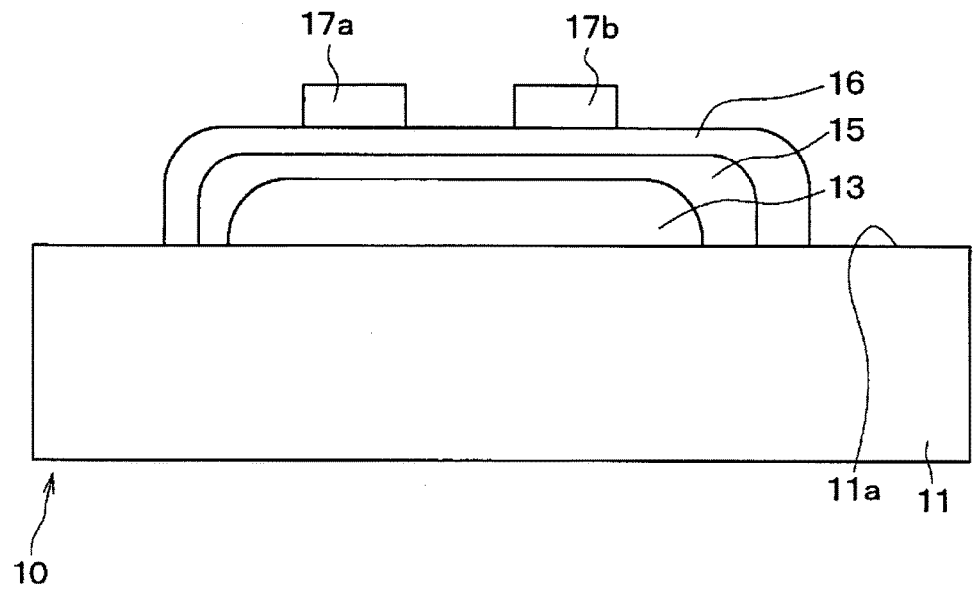

FIG. 13 is a diagram illustrating a cross-sectional configuration of a magnetic sensor according to a sixth embodiment of the present disclosure.

Figure 14:
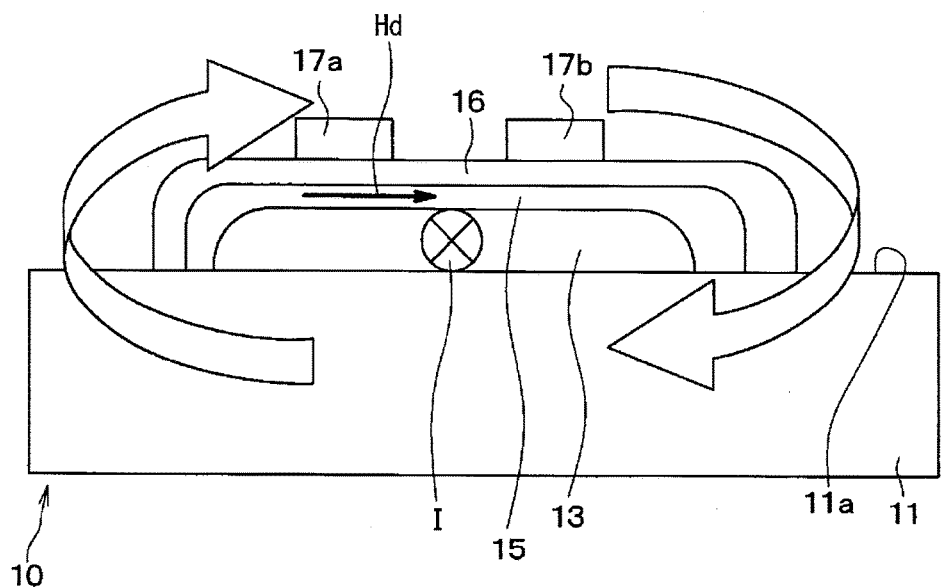

FIG. 14 is a diagram for explaining an operation of the magnetic sensor according to the sixth embodiment.

Figure 15:
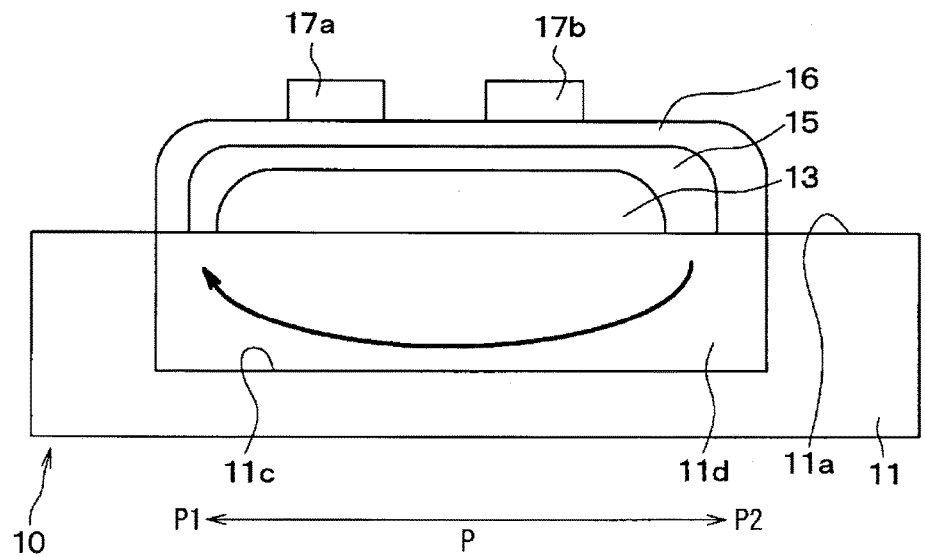

FIG. 15 is a diagram illustrating a cross-sectional configuration of a magnetic sensor according to a seventh embodiment of the present disclosure.

Figure 16:
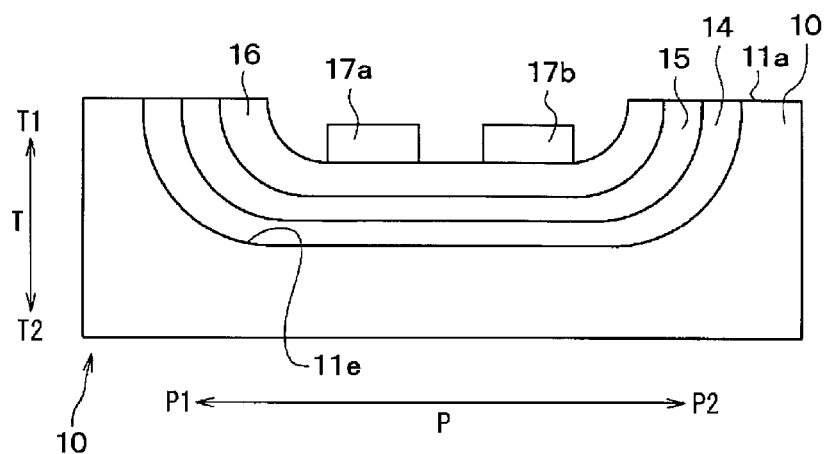

FIG. 16 is a diagram illustrating a cross-sectional configuration of a magnetic sensor according to an eighth embodiment of the present disclosure.

Figure 17:
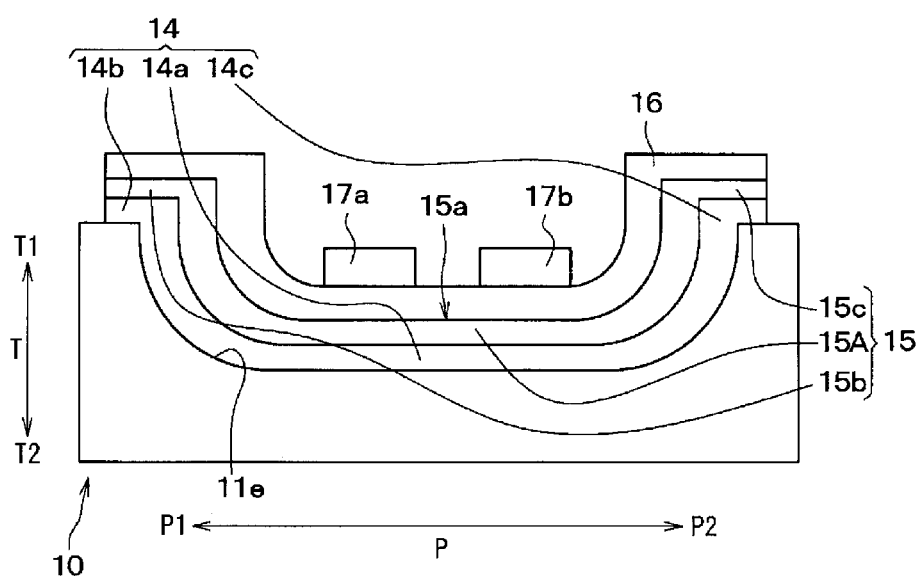

FIG. 17 is a diagram illustrating a cross-sectional configuration of a magnetic sensor according to a ninth embodiment of the present disclosure.

Figure 18:
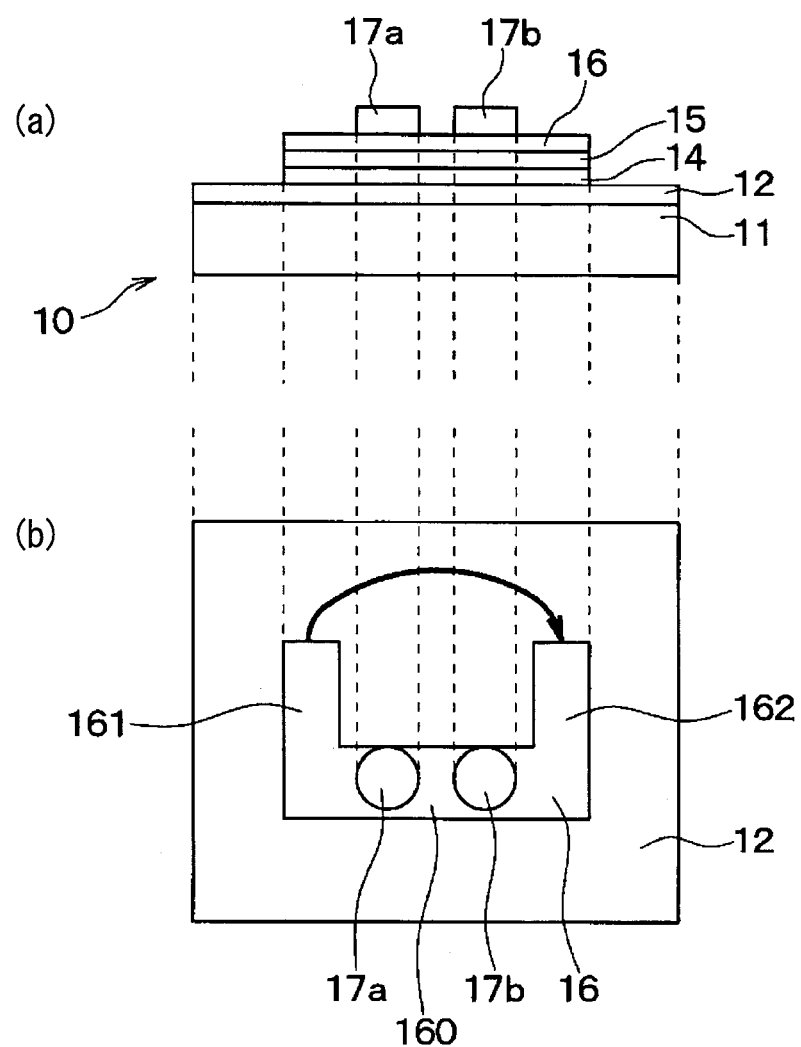

(a) of FIG. 18 is a diagram illustrating a cross-sectional view of a magnetic sensor according to a tenth embodiment of the present disclosure, and (b) of FIG. 18 is a diagram illustrating a plan view of the magnetic sensor according to the tenth embodiment.

Figure 19:
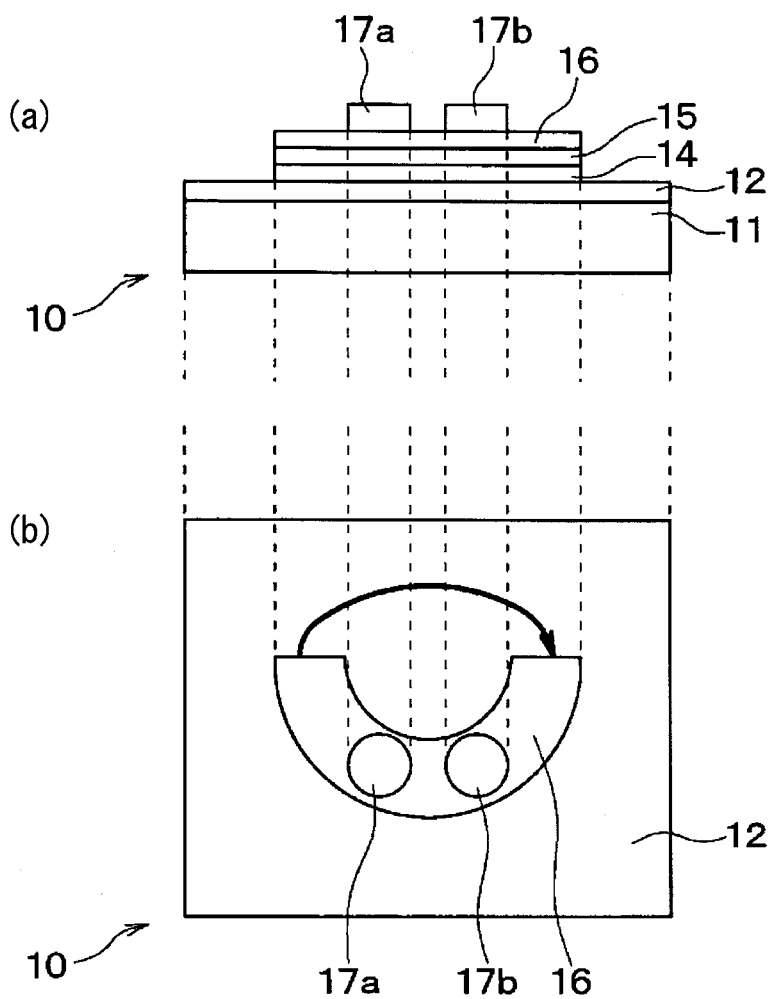

(a) of FIG. 19 is a diagram illustrating a cross-sectional view of a magnetic sensor according to an eleventh embodiment of the present disclosure, and (b) of FIG. 19 is a diagram illustrating a plan view of the magnetic sensor according to the eleventh embodiment.

Figure 20:
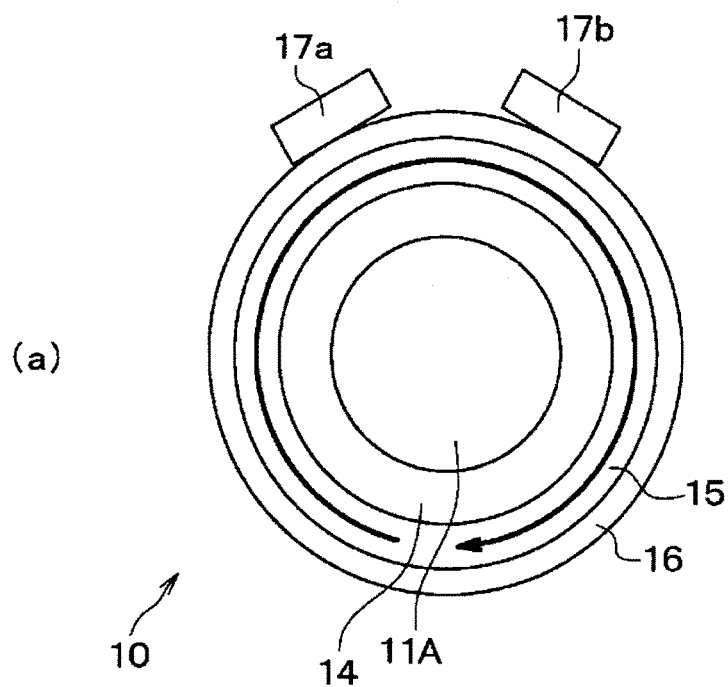
Figure 20:
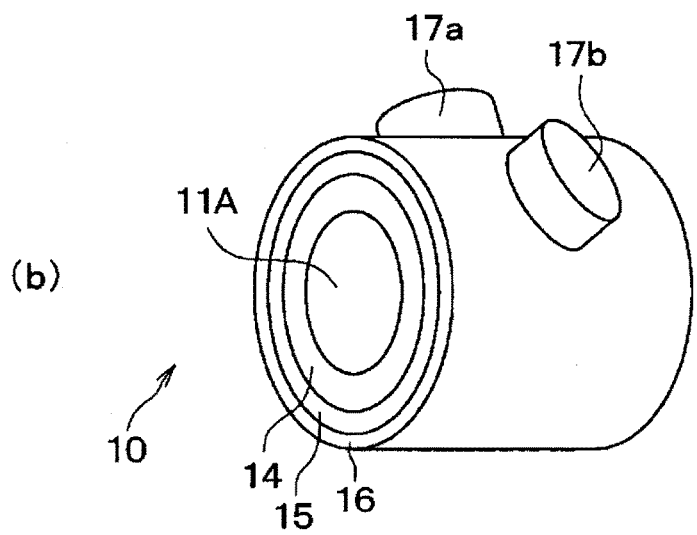

(a) of FIG. 20 is a view illustrating a cross section of a magnetic sensor according to a twelfth embodiment of the present disclosure, and (b) of FIG. 20 is a diagram illustrating a perspective view of the magnetic sensor according to the twelfth embodiment.

Figure 21:
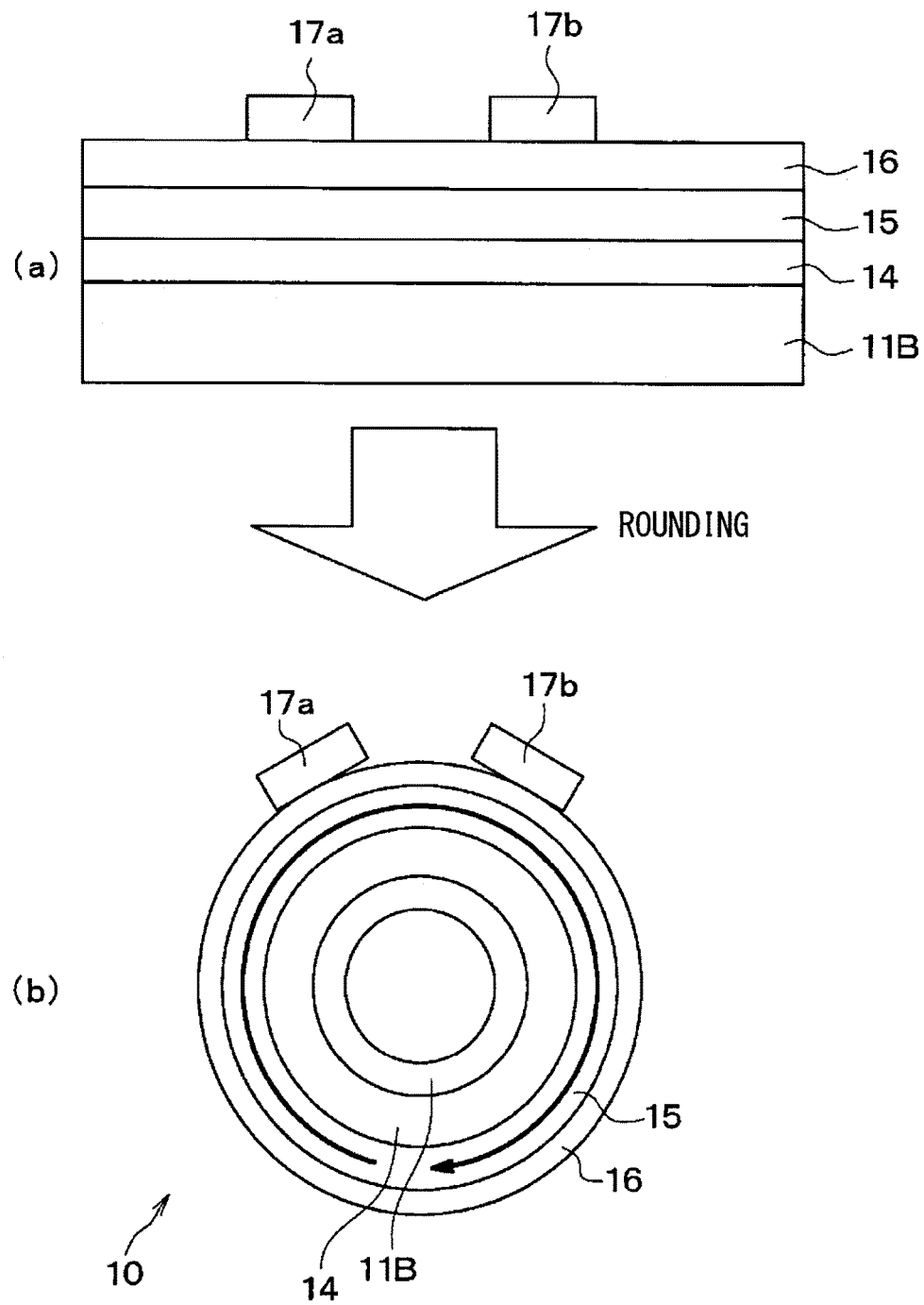

(a) of FIG. 21 is a diagram illustrating a cross-sectional view of a state in which a base material of a magnetic sensor according to a thirteenth embodiment of the present disclosure is not rounded, and (b) of FIG. 21 is a diagram illustrating a cross-sectional view of a state in which the base material of (a) of FIG. 21 is rounded.

Figure 22:
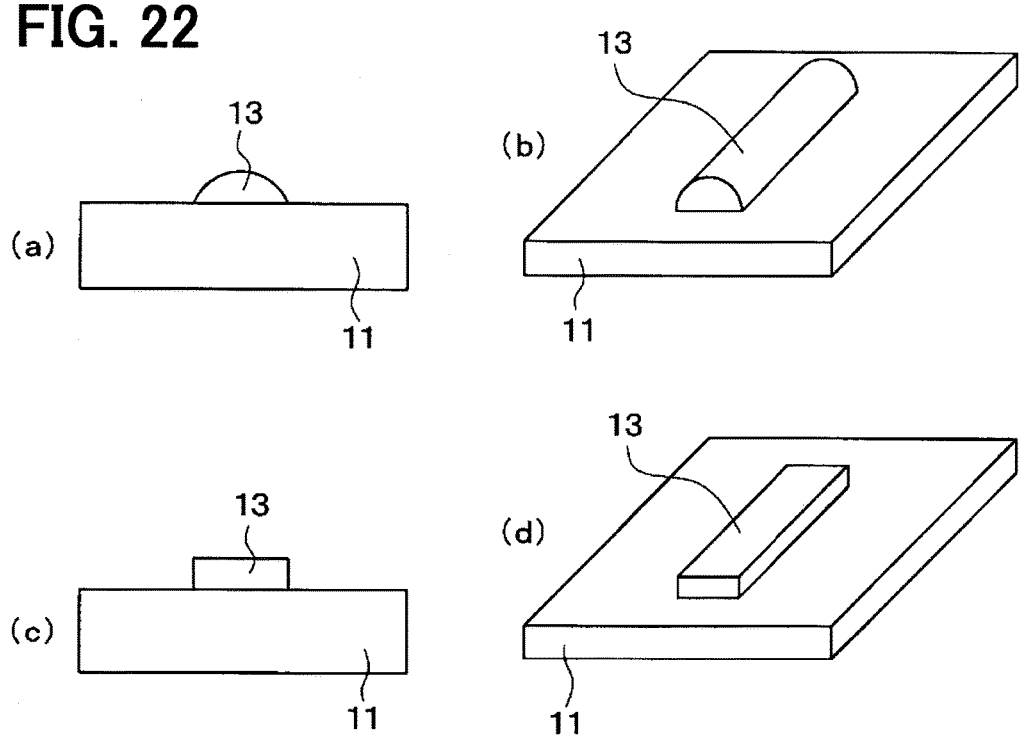

(a) to (d) of FIG. 22 are diagrams illustrating a substrate and a projection portion according to other embodiments of the present disclosure.

Figure 23:
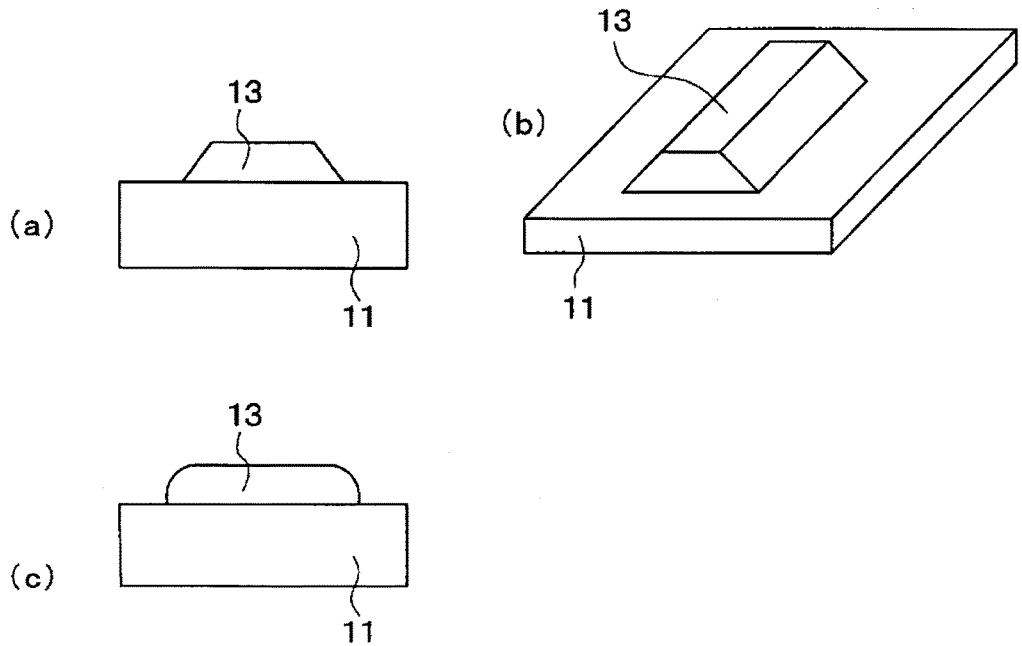

(a) to (c) of FIG. 23 are diagrams illustrating a substrate and a projection portion according to other embodiments of the present disclosure.

Figure 24:
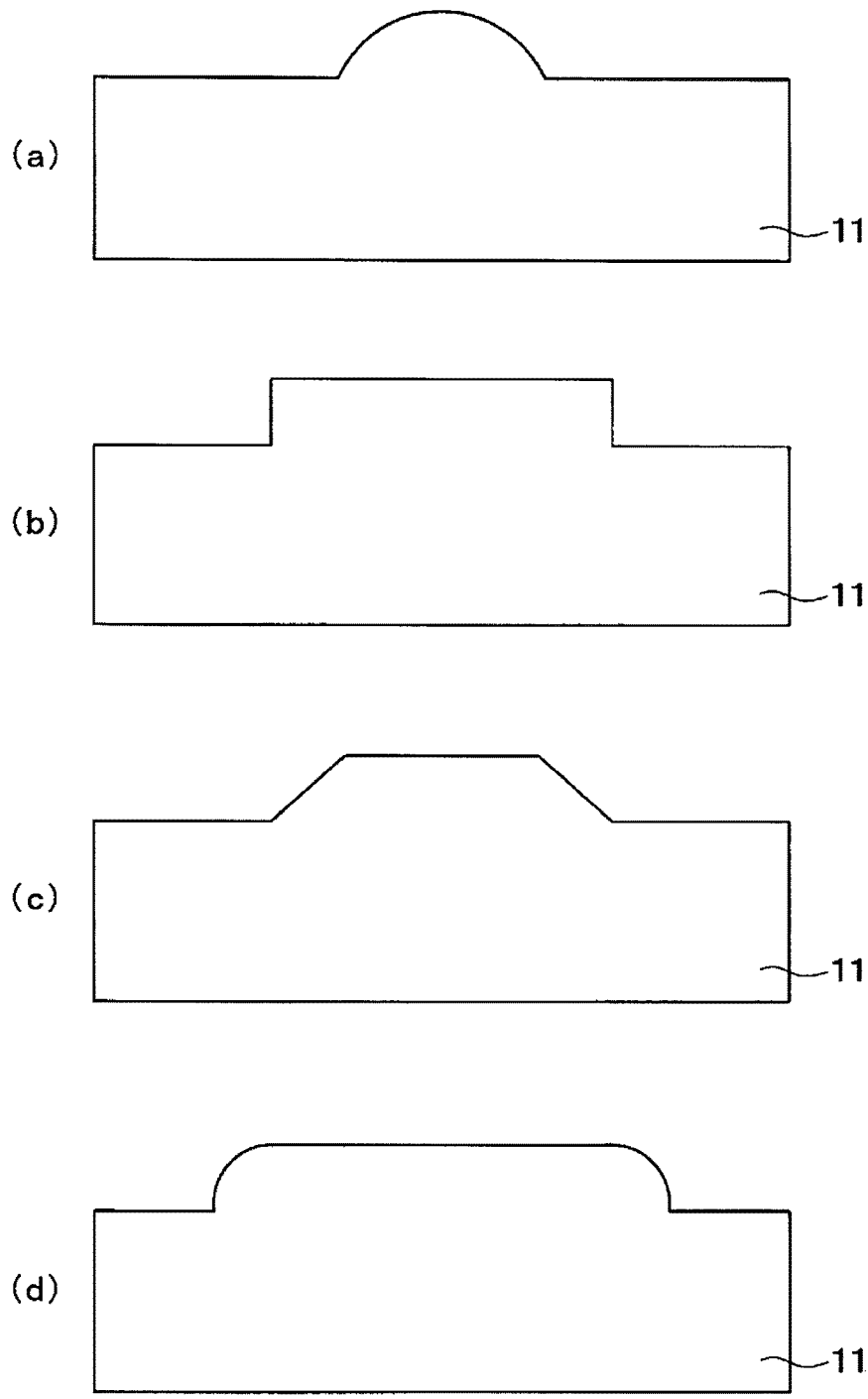

(a) to (d) of FIG. 24 are diagrams illustrating a substrate according to other embodiments of the present disclosure.

Figure 25:
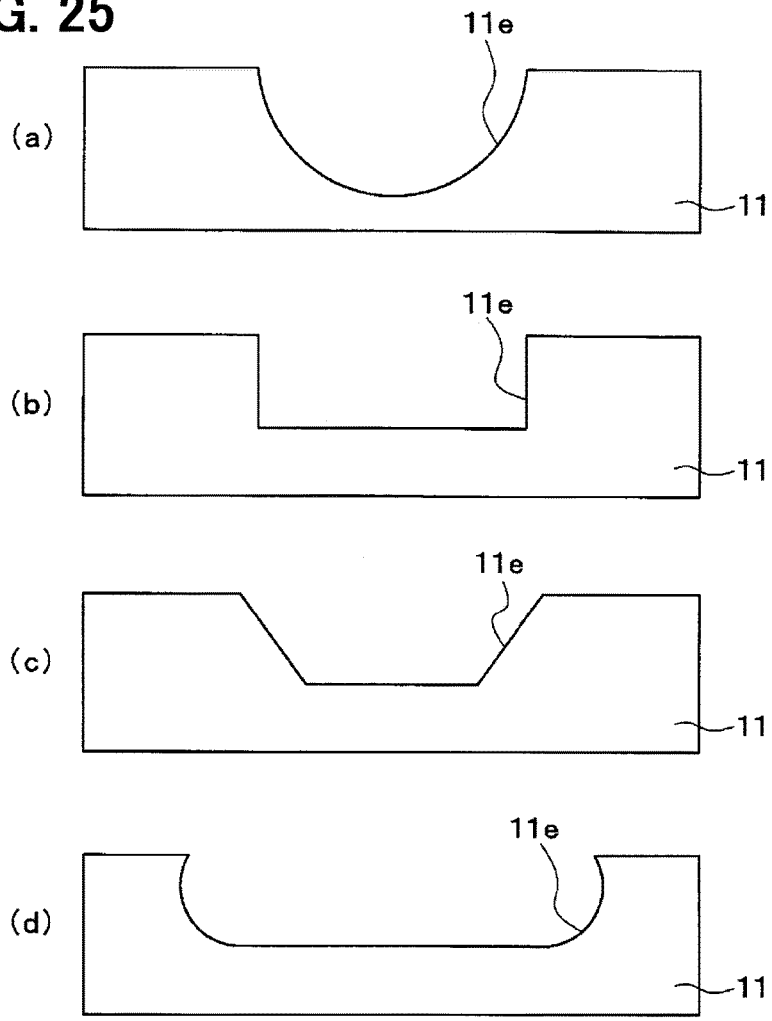

(a) to (d) of FIG. 25 are diagrams illustrating a substrate according to other embodiments of the present disclosure.

Figure 26:
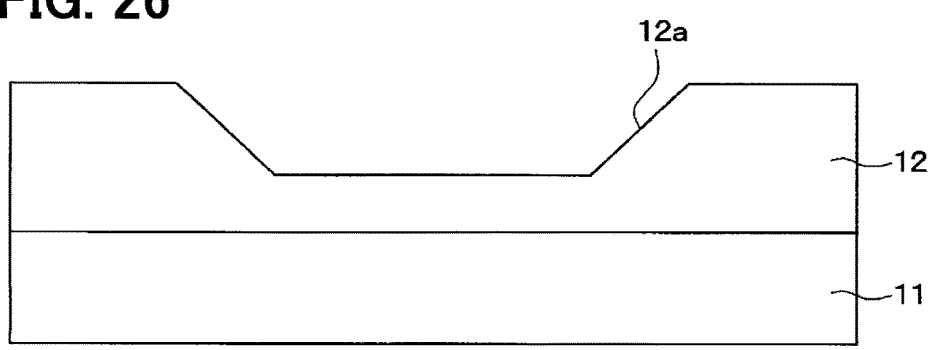

FIG. 26 is a diagram illustrating a substrate and an insulating layer according to another embodiment of the present disclosure.

Figure 27:
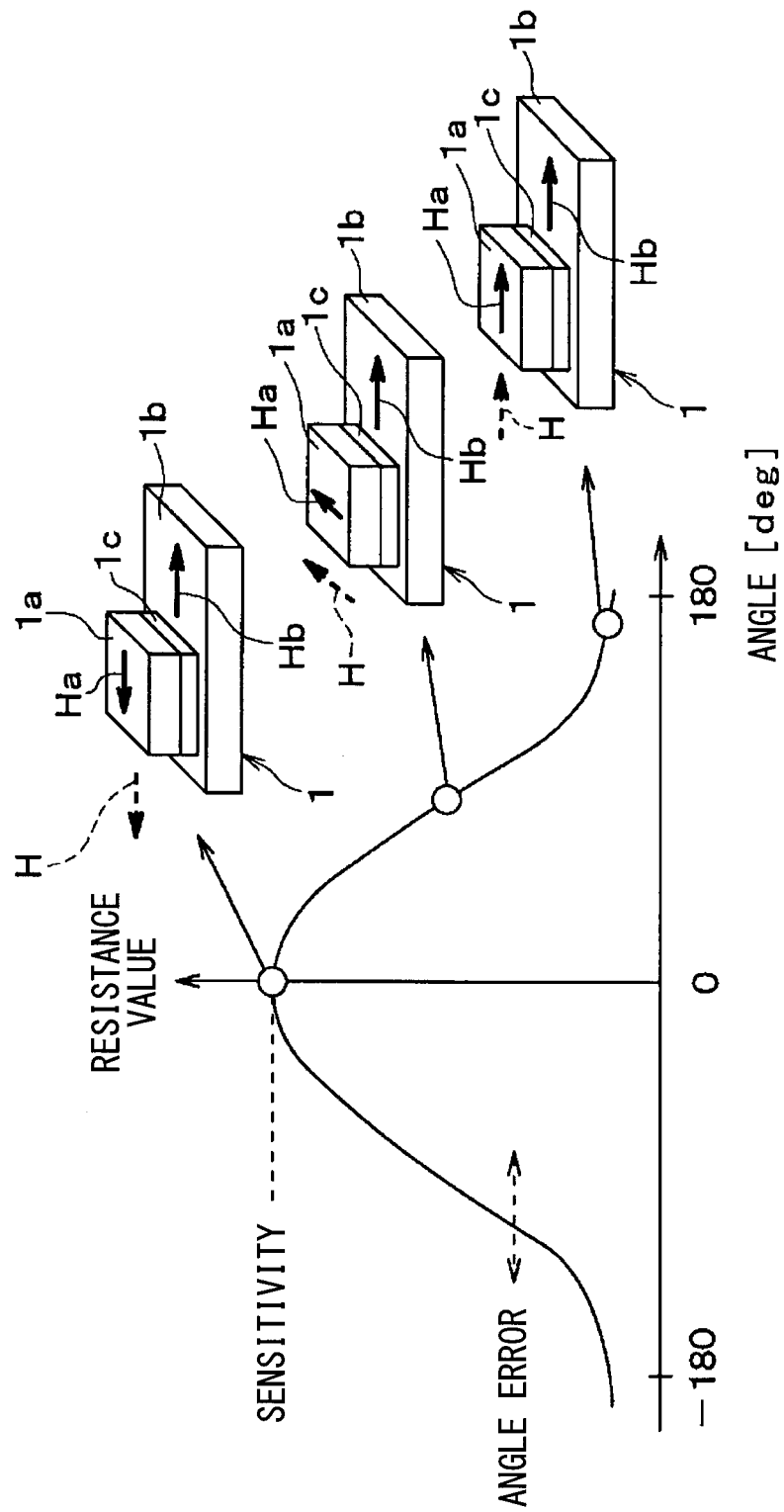

FIG. 27 is a diagram illustrating an operation of a multilayer film magnetic device in a prior art.

Figure 28:
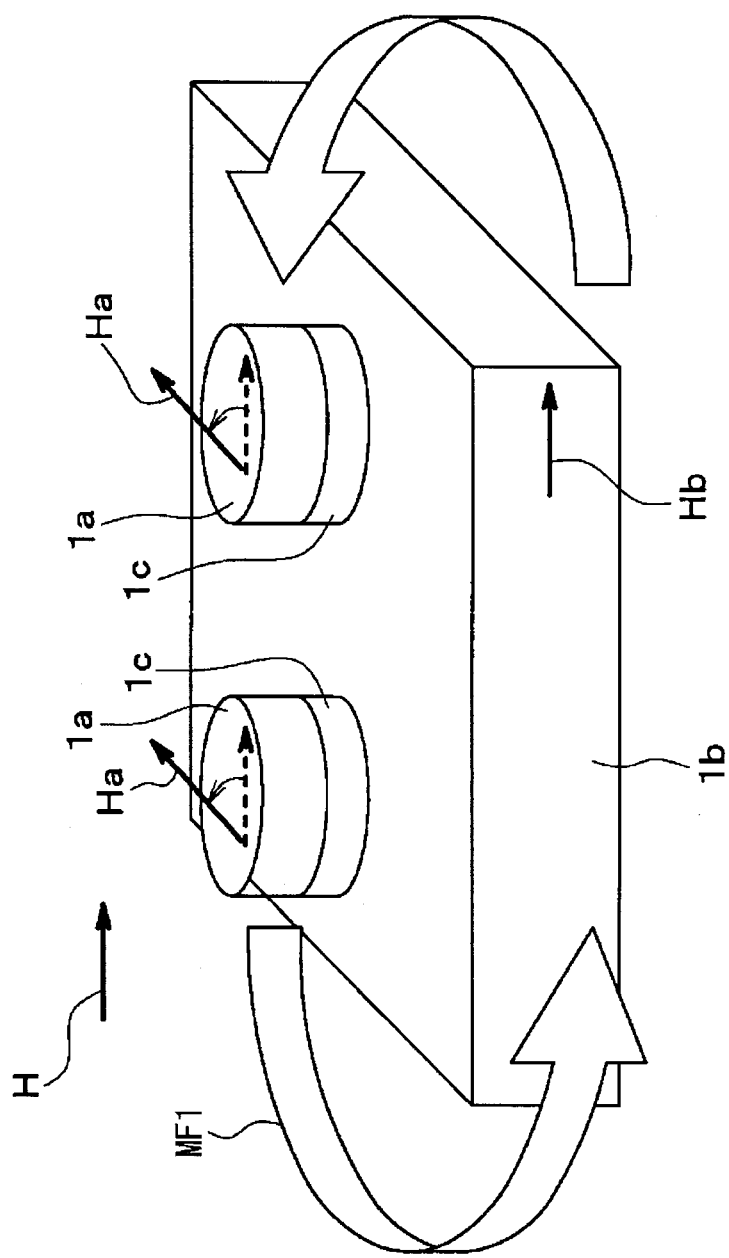

FIG. 28 is a diagram for explaining a problem of the multilayer film magnetic device in a prior art.

Figure 29:
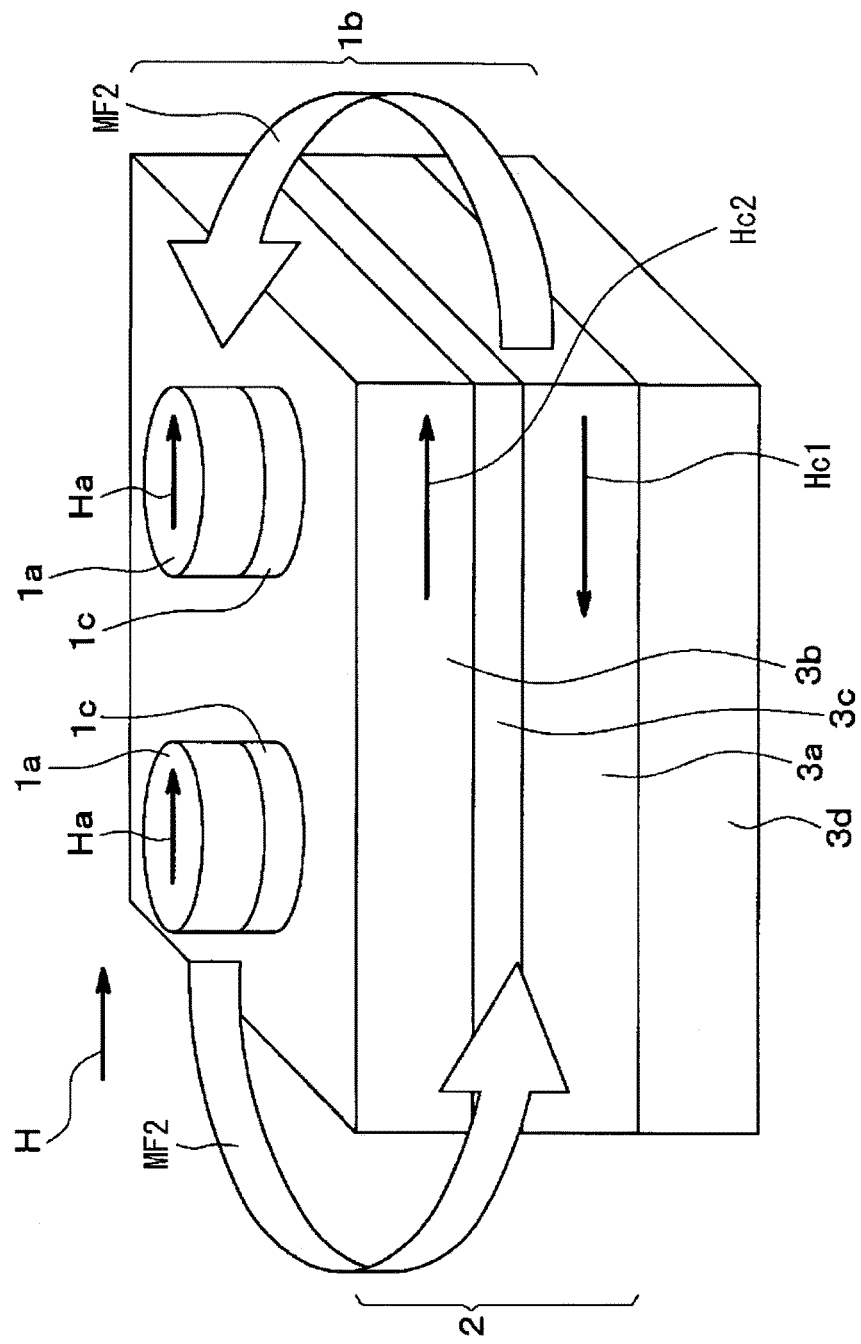

FIG. 29 is a diagram for explaining a problem of the multilayer film magnetic device in a prior art.

DESCRIPTION OF EMBODIMENTS

Hereinafter, embodiments of the present disclosure will be described with reference to the accompanying drawings. Further, in each of the embodiments below, portions which are the same as or equivalent to each other are denoted by the same reference numerals in the drawings for simplifying the description.

Figure 1:
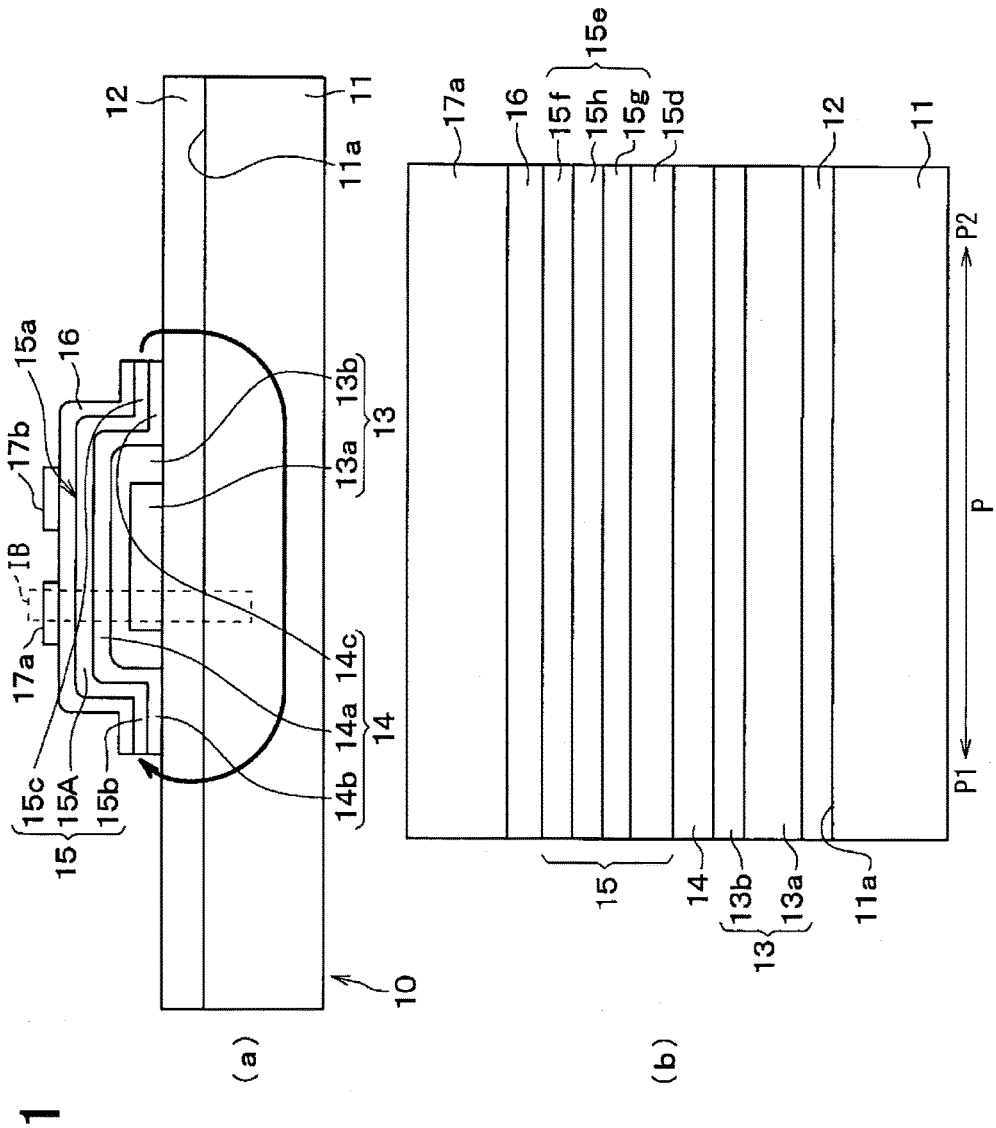
Figure 2:
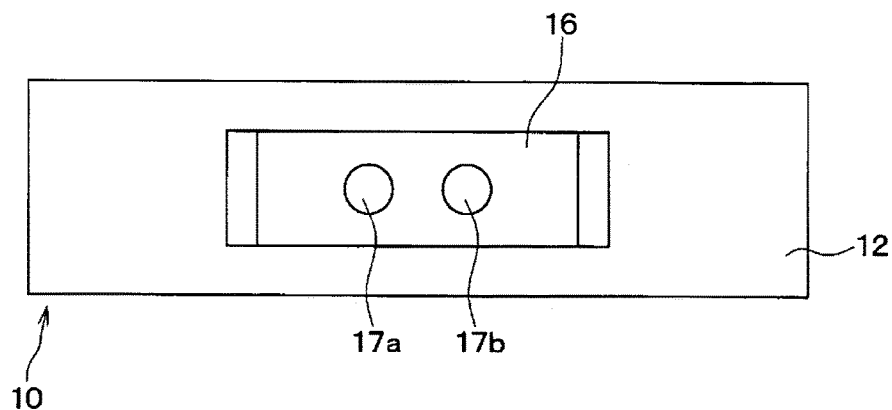
FIG. 2 is a diagram illustrating a plan view of the magnetic sensor according to the first embodiment.
Figure 3:
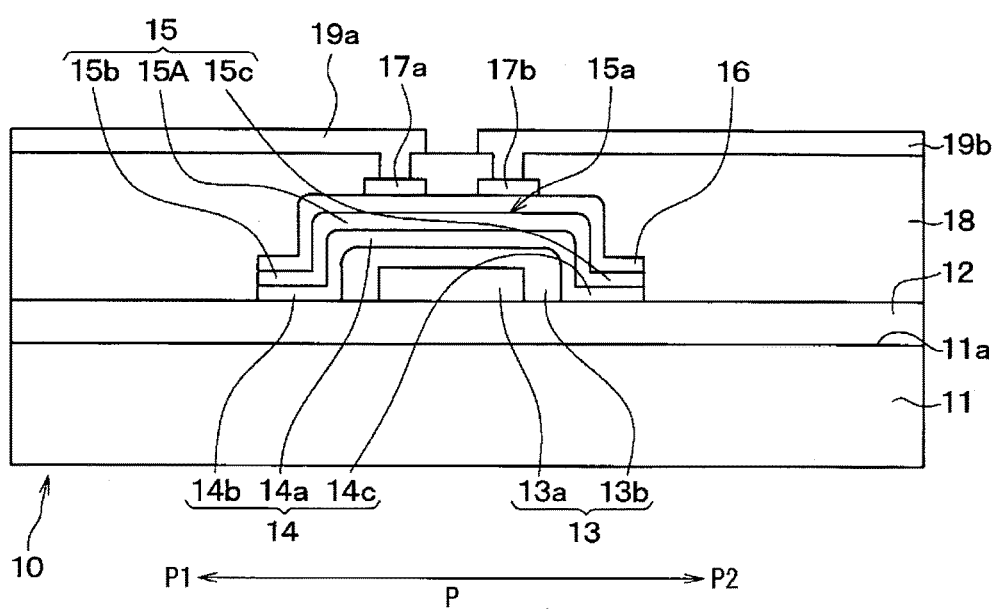
FIG. 3 is a diagram specifically illustrating the cross-sectional configuration of the magnetic sensor according to the first embodiment.

First Embodiment (a) of FIG. 1 is a diagram schematically illustrating a cross-sectional view of a magnetic sensor 10 according to the present embodiment. (b) of FIG. 1 is a diagram illustrating an enlarged view of an IB portion of (a) of FIG. 1. FIG. 2 is a diagram illustrating a plan view of the magnetic sensor 10 according to the present embodiment. FIG. 3 is a diagram specifically illustrating a cross-sectional view of the magnetic sensor 10 according to the present embodiment.

The magnetic sensor 10 includes a substrate 11, an insulating layer 12, a projection portion 13, a wiring layer 14, a pinned layer 15, a tunnel layer 16, and free layers 17a and 17b, as illustrated in (a) of FIG. 1, FIG. 2 and FIG. 3. As illustrated in FIG. 3, a protective film 18 and wiring layers 19a and 19b are provided in the magnetic sensor 10.

The substrate 11 is a thin plate member made of, for example, a silicon wafer. The insulating layer 12 is made of an electric insulating material such as SiO2 and SiN, and is arranged on a surface 11a of the substrate 11.

The projection portion 13 is arranged on the opposite side of the substrate 11 with respect to the insulating layer 12 and has a shape of projection projecting in a plate thickness direction in cross-section.

Specifically, the projection portion 13 includes a first projection layer 13a and a second projection layer 13b. The projection layer 13a has a shape of projection projecting in the plate thickness direction with respect to the insulating layer 12 in cross section. The projection layer 13b has a bent shape in cross section so as to cover the projection layer 13a on the opposite side of the substrate 11 with respect to the insulating layer 12. That is, in the cross section of the projection 13, the contour of the projection 13 on the opposite side of the substrate 11 has a bent shape.

The projection layers 13a and 13b of the present embodiment are made of an electric insulating material such as SiO2 or SiN, or a conductive metal material such as Cu.

The wiring layer 14 is arranged on the opposite side of the substrate 11 with respect to the insulating layer 12 and has a shape in which a bent portion 14a and projection portions 14b and 14c are included.

The bent portion 14a has a bent shape in cross section so as to cover the projection portion 13 on the opposite side of the substrate 11 with respect to the projection portion 13. The projection portion 14b projects from the bent portion 14a in a direction P1 of a planar direction P of the substrate 11, along the insulating layer 12. The projection portion 14c projects from the bent portion 14a along the insulating layer 12 in an opposite direction P2 (that is, another direction in the planar direction), which is opposite to the direction P1 of the planar direction P. The wiring layer 14 of the present embodiment is made of a conductive metal material such as Cu or Al.

The pinned layer 15 is a magnetization fixed layer whose magnetization direction is fixed. The magnetization direction of the pinned layer 15 is set to a direction parallel to the planar direction P of the substrate 11. The planar direction P of the substrate 11 is a direction in which the substrate 11 expands and corresponds to a direction parallel to the surface of the substrate 11. In addition, the plate thickness direction corresponds to a direction orthogonal to the planar direction P of the substrate 11. The pinned layer 15 is arranged on the opposite side of the substrate 11 with respect to the insulating layer 12 and is formed in a shape in which a bent portion 15A and projection portions 15b and 15c are included.

The bent portion 15A has a bent shape in cross section so as to cover the wiring layer 14 from the opposite side of the substrate 11 with respect to the wiring layer 14. In the bent portion 15A, a flat portion 15a defines a planar direction parallel to the planar direction P of the substrate 11, and a portion (first end portion) on an end of and a portion (second end portion) on another end of the flat portion 15a are respectively bent toward the substrate 11 (that is, opposite to the free layers 17a and 17b). The projection portion 15b projects from the bent portion 15A along the projection portion 14b of the wiring layer 14 in the direction P1 of the planar direction. The projection portion 15c projects from the bent portion 15A along the projection portion 14c of the wiring layer 14 in the direction P2 opposite to the direction P1 of the planar direction (that is, another direction in the planar direction).

The pinned layer 15 of the present embodiment includes an antiferromagnetic layer 15d and a laminated ferrimagnetic layer 15e as illustrated in (b) of FIG. 1. The antiferromagnetic layer 15d is made of an antiferromagnetic material and is arranged adjacent to the wiring layer 14. The laminated ferrimagnetic layer 15e is made of a magnetic layer 15g arranged adjacent to the antiferromagnetic layer 15d, a magnetic layer 15f arranged on the opposite side of the antiferromagnetic layer 15d with respect to the magnetic layer 15g, and a non-magnetic layer 15h arranged between the magnetic layer 15f and the magnetic layer 15g.

The tunnel layer 16 is a non-magnetic intermediate layer and is formed so as to cover the pinned layer 15 on the opposite side of the substrate 11 with respect to the pinned layer 15.

The free layers 17a and 17b are ferromagnetic layers whose magnetization direction changes according to an external magnetic field. The size of the free layer 17a in the planar direction P is set to a size smaller than the size of the pinned layer 15 in the planar direction P. Similarly, the size of the free layer 17b in the planar direction P is set to a size smaller than the size of the pinned layer 15 in the planar direction P.

The free layers 17a and 17b of the present embodiment are mounted on a portion corresponding to the flat portion 15a of the pinned layer 15 in the tunnel layer 16.

The protective film 18 of FIG. 3 is formed so as to cover the insulating layer 12, the projection portion 13, the wiring layer 14, the pinned layer 15, the tunnel layer 16, and the free layers 17a and 17b on the opposite side of the substrate 11. The wiring layers 19a and 19b are formed so as to cover the protective film 18 on the opposite side of the substrate 11. The wiring layer 19a is arranged on a side in the direction P1 of the planar direction and is connected to the free layer 17a. The wiring layer 19b is arranged on a side in the direction P2 of the planar direction and is connected to the free layer 17b. The wiring layers 19a and 19b of the present embodiment are made of a conductive metal material such as Cu or Al.

Figure 4:
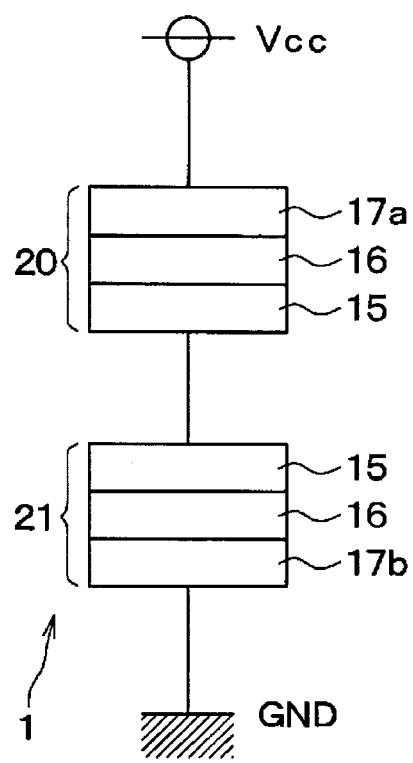
FIG. 4 is a diagram illustrating an equivalent circuit of the magnetic sensor according to the first embodiment.

Next, the configuration of an electric circuit of the magnetic sensor 10 of the present embodiment will be described. FIG. 4 is a diagram illustrating an equivalent circuit of the magnetic sensor 10 of the present embodiment.

The free layer 17a is connected to a power source Vcc. The free layer 17b is connected to the ground. Therefore, a TMR element (Tunneling Magneto Resistance) 20 is made of the free layer 17a, the pinned layer 15, and the tunnel layer 16 and a TMR element 21 is made of the free layer 17b, the pinned layer 15, and the tunnel layer 16. As such, the TMR elements 20 and 21 are connected to each other in series between the power source Vcc and the ground.

Next, the process of producing the magnetic sensor 10 of the present embodiment will be described with reference to (a) to (e) of FIG. 5 and (a) to (d) of FIG. 6. (a) to (e) of FIG. 5 and (a) to (d) of FIG. 6 are diagrams illustrating the process of producing the magnetic sensor 10.

First, the insulating layer 12 is formed on the surface 11a of the substrate 11 in a first step (see (a) of FIG. 5). Examples of a method of producing the insulating layer 12 include thermal oxidation, CVD, and sputtering.

In a subsequent second step, a projection layer 13A is formed on the insulating layer 12 (see (b) of FIG. 5). Examples of a method of producing the projection layer 13A include thermal oxidation, CVD, and sputtering.

In a subsequent third step, the projection layer 13a is formed by removing an extra region from the projection layer 13A by performing photolithography or etching (for example, milling or RIE) on the projection layer 13A (see (c) of FIG. 5).

In a subsequent fourth step, a projection layer 13B is formed so as to cover the insulating layer 12 and the projection layer 13a (see (d) of FIG. 5).

In a subsequent fifth step, the projection layer 13b is formed by removing an extra region from the projection layer 13B by performing photolithography or etching (for example, milling or RIE) on the projection layer 13B (see (e) of FIG. 5).

In a subsequent sixth step, the wiring layer 14 is formed so as to cover the projection layer 13b and the insulating layer 12 (see (a) of FIG. 6). In addition, the pinned layer 15, the tunnel layer 16, and a free layer 17A are respectively formed on the opposite side of the substrate 11 with respect to the wiring layer 14.

In a subsequent seventh step, the pinned layer 15, the tunnel layer 16, and the free layer 17A are respectively patterned by performing photolithography or etching (for example, milling or RIE) (see (b) of FIG. 6).

In a subsequent eighth step, the free layers 17a and 17b are respectively formed by removing an extra region from the free layer 17A by performing photolithography or etching (for example, milling or RIE) on the patterned free layer 17A (see (c) of FIG. 6).

In a subsequent ninth step, the protective film 18 is formed using sputtering or the like so as to cover the wiring layer 14, the tunnel layer 16, and the free layers 17a and 17b respectively ((d) of FIG. 6). In addition, contact holes 18a and 18b are formed with respect to the protective film 18 using dry etching or wet etching. The contact holes 18a and 18b are formed so as to face the free layers 17a and 17b. Further, the wiring layers 19a and 19b are respectively formed by filling the contact holes 18a and 18 with a conductive material. In this manner, the TMR elements 20 and 21 can be formed. Subsequently, the magnetization direction is set by magnetizing the pinned layer 15 common to the TMR elements 22 and 21.

According to the present embodiment described above, the pinned layer 15 includes the bent portion 15A having the bent shape in cross section and covering the wiring layer 14 on the opposite side of the substrate 11 with respect to the wiring layer 14. The free layers 17a and 17b are arranged on the opposite side of the substrate 11 with respect to the pinned layer 15. The size of the free layers 17a and 17b in the planar direction P is set to a size smaller than the size of the pinned layer 15 in the planar direction P. Therefore, a magnetic field (see a thick arrow of FIG. 1) leaking from the pinned layer 15 forms a closed loop adjacent to the substrate 11 (that is, on the opposite side of the free layers 17a and 17b with respect to the pinned layer 15). As such, the influence of the magnetic field leaking from the pinned layer 15 on the free layers 17a and 17b can be restricted. Accordingly, the magnetization direction of the free layers 17a and 17b follows the external magnetic field to be changed.

Here, the resistance value between the free layer 17a and the pinned layer 15 is changed due to the angle between the magnetization direction of the free layer 17a and the magnetization direction of the pinned layer 15. The resistance value between the free layer 17b and the pinned layer 15 is changed due to the angle between the magnetization direction of the free layer 17b and the magnetization direction of the pinned layer 15. Accordingly, the external magnetization direction applied to the magnetic sensor 10 can be measured by measuring the current flowing in the TMR elements 20 and 21 between the power source Vcc and the ground.

Second Embodiment

In the first embodiment described above, the example in which the pinned layer 15 has the shape that includes the projection portions 15b and 15c projecting in the direction P1 and the opposite direction P2 of the planar direction from the bent portion 15A has been described. Alternative to such a shape, in the present embodiment, the pinned layer 15 has a bent shape in cross section that covers the wiring layer 14 on the opposite side of the substrate 11 with respect to the wiring layer 14 without having the projection portions 15b and 15c, as illustrated in FIGS. 7 and 8. That is, the pinned layer 15 is formed of only the bent portion 15A. In this case, similarly to the first embodiment described above, the magnetic field leaking from the pinned layer 15 (see a thick arrow of FIG. 7) can form a closed loop adjacent to the substrate 11. FIG. 7 is a diagram schematically illustrating a cross-sectional view of the magnetic sensor 10 of the present embodiment. In FIG. 7, reference numerals which are the same as those of (a) of FIG. 1 indicate the same elements. FIG. 8 is a diagram illustrating a plan view of the magnetic sensor 10 of the present embodiment.

The present embodiment configured in this manner may define the cross-sectional shape of the pinned layer 15 as follows.

In particular, as shown in (a) of FIG. 9, a rectangle 100 has a first side 101 and a second side 102 opposed to each other. A dimension between ends of the first side 101 is referred to as La, and a dimension between ends of the second side 102 is referred to as Lb. The cross-sectional shape of the pinned layer 15 is defined by a shape that is provided by modifying the rectangle 100 to satisfy a relationship of La>Lb (see (b) of FIG. 9). (b) of FIG. 9 illustrates the shape in which end portions of the rectangle 100 are bent to form a U shape.

Third Embodiment

The example of the magnetic sensor 10 formed with the TMR elements 20 and 21 has been described in the first embodiment and the second embodiment. Alternative to the example described above, an example of a magnetic sensor 10 formed with a first GMR (Giant Magneto Resistance: GMR) element and a second GMR element will be described in the present embodiment.

FIG. 10 is a diagram illustrating a cross-sectional view of the magnetic sensor 10 of the present embodiment. In FIG. 10, reference numerals which are the same as those of FIG. 7 indicate the same elements.

In FIG. 10, a non-magnetic layer 16a replacing the tunnel layer 16 of FIG. 7 is used. Accordingly, the first GMR element is made of the free layer 17a, the non-magnetic layer 16a, and the pinned layer 15 and the second GMR element is made of the free layer 17b, the non-magnetic layer 16a, and the pinned layer 15.

Fourth Embodiment

The examples of using the pinned layer 15 made of the antiferromagnetic layer 15d and the laminated ferrimagnetic layer 15e have been described in the first to third embodiments described above. Alternative to the examples described above, an example of using a pinned layer 15X made of a material with high coercive force will be described as illustrated in (a) and (b) of FIG. 11.

(a) of FIG. 11 is a diagram schematically illustrating a cross-sectional view of the magnetic sensor 10 according to the present embodiment. (b) of FIG. 11 is a diagram illustrating an enlarged view of an XIB portion of (a) of FIG. 11. In (a) of FIG. 11, reference numerals which are the same as those of FIG. 7 indicate the same elements. The material with high coercive force, which constitutes the pinned layer 15X of the present embodiment, is a material having coercive force higher than that of the free layers 17a and 17b, and a permanent magnet or the like may be exemplified.

In the present embodiment, the pinned layer 15X can be made of a single layer formed of a material with high coercive force, as described above. Accordingly, preparation of the magnetic sensor becomes easy and a decrease in cost of film formation and an improvement of throughput can be realized.

Here, in a case where a heat treatment is performed for increasing sensor sensitivity, mutual diffusion may be generated in the pinned layer 15 when the laminated ferrimagnetic layer 15e and the antiferromagnetic layer 15d are used as the pinned layer 15 as described in the first embodiment.

Meanwhile, in the present embodiment, the pinned layer 15X may be made of a single layer formed of a material with high coercive force as described above. Therefore, the mutual diffusion is not generated in the pinned layer 15X even when the heat treatment is performed and the heat treatment can be performed at a high temperature.

Fifth Embodiment

The example of the pinned layer 15X having the bent shape in cross section has been described in the fourth embodiment described above. Alternative to the example, as illustrated in FIG. 12, the pinned layer 15X may be formed into a shape that includes the curve portion 15A and the projection portions 15b and 15c, in the present embodiment, similarly to the first embodiment as described above. FIG. 12 is a diagram schematically illustrating a cross-sectional view of the magnetic sensor 10 of the present embodiment. In FIG. 12, reference numerals which are the same as those of FIG. 7 indicate the same elements.

Sixth Embodiment

The examples in which the projection portion 13 and the wiring layer 14 are arranged between the substrate 11 and the pinned layer 15 (15X) has been described in the first to fourth embodiments described above. Alternative to the examples, an example in which the wiring layer is provided by the projection portion 13 will be described in the present embodiment. FIG. 13 is a diagram schematically illustrating a cross-sectional view of the magnetic sensor 10 of the present embodiment. In FIG. 13, reference numerals which are the same as those of FIG. 7 indicate the same elements.

In the present embodiment, the projection portion 13 made of a conductive material is used, as illustrated in FIGS. 13 and 14. For this reason, a function of the wiring layer can be performed by the projection portion 13. Therefore, a magnetization direction Hd can be set with respect to the pinned layer 15 using a magnetic field generated by a current I flowing in the projection portion 13 in a direction vertical to the paper surface in FIG. 14.

Seventh Embodiment

In the present embodiment, an example in which the substrate 11 is configured such that a member having high permeability, which is made of a material with high permeability, is embedded therein is described as illustrated in FIG. 15. FIG. 15 is a diagram schematically illustrating a cross-sectional view of the magnetic sensor 10 of the present embodiment. In FIG. 15, reference numerals which are the same as those of FIG. 14 indicate the same elements.

A recessed portion 11c is formed in a portion corresponding to the wiring layer 14, the pinned layer 15, and the tunnel layer 16 in the substrate 11 of the present embodiment. The recessed portion 11c is formed so as to be open on a side adjacent to the wiring layer 14. A high permeability member 11d having high permeability, which is made of a material having high permeability, is arranged in the recessed portion 11c. The high permeability member 11d having high permeability forms a magnetic field path through which a magnetic field (FIG. 15, see a solid arrow) leaking from the pinned layer 15 passes. Therefore, the influence of the magnetic field leaking from the pinned layer 15 on the free layers 17a and 17b can be more restricted.

Eighth Embodiment

The examples of the pinned layer 15 (15X) having the shape in which the portion (first end portion) of the flat portion 15a in the direction P and the portion (second end portion) of the flat portion 15a in the opposite direction P2 from the flat portion 15a are respectively bent toward the substrate 11 have been described in the first to seventh embodiments described above. Alternative to the examples, an example of the pinned layer 15 (15X) having a bent cross-sectional shape in which the portion (first end portion) of the flat portion 15a in the direction P1 and the portion (second end portion) of the flat portion 15a in the opposite direction P2 are respectively bent in a direction toward the free layers 17a and 17b will be described in the present embodiment.

FIG. 16 is a diagram schematically illustrating a cross-sectional view of the magnetic sensor 10 of the present embodiment. In FIG. 16, reference numerals which are the same as those of FIG. 14 indicate the same elements.

A recessed portion 11e is formed on the surface 11a of the substrate 11 of the present embodiment. In the cross-section of the recessed portion 11e, the contour of the inner surface of the recessed portion 11e has a bent shape. The wiring layer 14 is formed in a thin film shape along the inner surface of the recessed portion 11e of the substrate 11. The pinned layer 15 is formed in a thin film shape along the wiring layer 14. Therefore, the pinned layer 15 has a bent shape in cross section in which the portion of the flat portion 15a in the planar direction P and the opposite portion of the flat portion 15a in the planar direction P are respectively bent in a direction opposite to the substrate 11. The tunnel layer 16 is formed into a shape of a thin film along the pinned layer 15. The free layers 17a and 17b are arranged on the opposite side of the pinned layer 15 with respect to the tunnel layer 16.

In the present embodiment configured in this manner, the free layers 17a and 17b are arranged in the recessed portion 11e. The portion on one side and the portion on another side of the pinned layer 15 in the planar direction P are respectively directed in a direction T1 of a plate thickness direction T of the substrate 11. The direction T1 of the plate thickness direction T indicates a direction toward the free layers 17a and 17b from the substrate 11, among the plate thickness directions of the substrate 11. Accordingly, a path of the magnetic field leaking from the pinned layer 15 can be formed in the one direction (upward direction) of the plate thickness direction T relative to the free layers 17a and 17b. Therefore, the influence of the magnetic field leaking from the pinned layer 15 on the free layers 17a and 17b can be restricted in the same manner as that of the first embodiment described above. T2 indicates the direction opposite to the direction T1 in the plate thickness direction T in FIG. 16.

Ninth Embodiment

The example of the pinned layer 15 (15X) having the bent shape in cross section has been described in the eighth embodiment described above. Alternative to the example, an example of forming the pinned layer 15 (15X) as illustrated in FIG. 17 will be described in the present embodiment.

FIG. 17 is a diagram illustrating a cross-sectional view of the magnetic sensor 10 according to the present embodiment. In FIG. 17, reference numerals which are the same as those of FIG. 16 indicate the same elements.

The wiring layer 14 of the present embodiment includes a bent portion 14a, a projection portion 14b, and a projection portion 14c. The bent portion 14a has a bent shape in cross section, along the inner surface of the recessed portion 11e of the substrate 11. The projection portion 14b projects from the bent portion 14a along the substrate 11 in the direction P1 of the planar direction P. The projection portion 14c projects from the bent portion 14a along the substrate 11 in the opposite direction P2 of the planar direction P.

The pinned layer 15 includes the bent portion 15A and the projection portions 15b and 15c. The bent portion 15A has a bent shape in cross section so as to cover the wiring layer 14 on the opposite side of the substrate 11 with respect to the wiring layer 14. In the bent portion 15A, a portion (first end portion) on one side and a portion (second end portion) on another side of the flat portion 15a, which defines a planar direction parallel to the planar direction P of the substrate 11, in the planar direction P are respectively bent toward the surface 11a side of the substrate 11. The projection portion 15b projects from the bent portion 15A along the projection portion 14b of the wiring layer 14 in the direction P1 of the planar direction P. The projection portion 15c projects from the bent portion 15A along the projection portion 14c of the wiring layer 14 in the opposite direction P2 of the planar direction P. The tunnel layer 16 has a bent shape along the pinned layer 15. The free layers 17a and 17b are arranged on the opposite side of the pinned layer 15 with respect to the tunnel layer 16 in the recessed portion 11e, in the same manner as that of the first embodiment.

According to the present embodiment as described above, the pinned layer 15 includes the bent portion 15A having the bent shape so as to cover the wiring layer 14 on the opposite side of the substrate 11 with respect to the wiring layer 14.

Therefore, similarly to the first embodiment as described above, the magnetic field leaking from the pinned layer 15 forms a path in the direction T1 (upward direction in the figure) of the plate thickness direction T relative to the free layers 17a and 17b. Accordingly, the influence of the magnetic field leaking from the pinned layer 15 on the free layers 17a and 17b can be restricted.

Tenth Embodiment

The examples in which the cross-sectional shape of the pinned layer 15 of the magnetic sensor 10 is made into a shape bent in the thickness direction (direction orthogonal to the planar direction) of the substrate 11 has been described in the first to ninth embodiments described above. Alternative to the examples, an example in which the cross-sectional shape of the pinned layer 15 is made into a shape bent in the planar direction of the substrate 11 will be described.

(a) of FIG. 18 is a diagram illustrating a cross-sectional view of the magnetic sensor 10 according to the present embodiment. (b) of FIG. 18 is a diagram illustrating a plan view of the magnetic sensor 10 according to the present embodiment. In (a) and (b) of FIG. 18, reference numerals which are the same as those of FIG. 1 indicate the same elements.

The magnetic sensor 10 includes the substrate 11, the insulating layer 12, the wiring layer 14, the pinned layer 15, the tunnel layer 16, and the free layers 17a and 17b as illustrated in (a) and (b) of FIG. 18.

The wiring layer 14 of the present embodiment is laminated on the opposite side of the substrate 11 with respect to the insulating layer 12. The pinned layer 15 is laminated on the wiring layer 14. The tunnel layer 16 is laminated on the pinned layer 15. The free layers 17a and 17b are arranged on the tunnel layer 16.

In the present embodiment configured in this manner, the wiring layer 14, the pinned layer 15, and the tunnel layer 16 are formed into a bent shape which is bent along the planar direction P of the substrate 11 when respectively seen from a direction orthogonal to the surface. The term "the direction orthogonal to the surface" means a direction orthogonal to the planar direction P of the substrate 11 and corresponds to the plate thickness direction T.

That is, the wiring layer 14, the pinned layer 15, and the tunnel layer 16 respectively include a bent portion having a bent shape in cross section bent along the planar direction P.

The tunnel layer 16 of the present embodiment is formed into a U shape in which a portion (first end portion) 161 on one side and a portion (second end portion) 162 on another side of the flat portion 160, which defines a planar direction parallel to the planar direction P of the substrate 11, are bent to be parallel to the planar direction P. For this reason, similarly, the wiring layer 14 and the pinned layer 15 are formed into a U shape. Accordingly, the magnetic field (see a thick arrow in FIG. 18(b)) leaking from the pinned layer 15 forms a closed loop excluding the free layers 17a and 17b. Therefore, in the similar manner to that of the first embodiment, the influence of the magnetic field leaking from the pinned layer 15 on the free layers 17a and 17b can be restricted. Accordingly, the magnetization direction of the free layers 17a and 17b follows the external magnetic field to be changed.

Eleventh Embodiment

The example in which the cross-sectional shape of the pinned layer 15 of the magnetic sensor 10 in the planar direction is the U shape has been described in the tenth embodiment described above. Alternative to the example, an example in which the cross-sectional shape of the pinned layer 15 in the planar direction is a C shape will be described.

(a) of FIG. 19 is a diagram illustrating a cross-sectional view of the magnetic sensor 10 according to the present embodiment. (b) of FIG. 19 is a diagram illustrating a plan view of the magnetic sensor 10 according to the present embodiment. In (a) and (b) of FIG. 19, reference numerals which are the same as those of FIG. 1 indicate the same elements.

The magnetic sensor 10 includes the substrate 11, the insulating layer 12, the wiring layer 14, the pinned layer 15, the tunnel layer 16, and the free layers 17a and 17b, as illustrated in (a) and (b) of FIG. 19.

In the present embodiment, the wiring layer 14, the pinned layer 15, and the tunnel layer 16 are formed into a C shape which is bent in the planar direction P of the substrate 11 when respectively seen from a direction orthogonal to the surface. That is, the cross-sectional shape of the substrate 11 in the planar direction P has the C shape in each of the wiring layer 14, the pinned layer 15, and the tunnel layer 16. In this case, the pinned layer 15 includes a bent portion having a bent shape in cross section in which the first end portion and the second end portion are bent relative to the middle portion in the direction parallel to the planar direction P of the substrate 11, in the similar manner to that of the tenth embodiment. Therefore, the magnetic field (see a thick arrow in FIG. 18) leaking from the pinned layer 15 forms the closed loop excluding the free layers 17a and 17b. Accordingly, in the similar manner to that of the tenth embodiment, the influence of the magnetic field leaking from the pinned layer 15 on the free layers 17a and 17b can be restricted.

Twelfth Embodiment

The examples in which the magnetic sensor 10 is made using the substrate 11 having a thin plate shape have been described in the first to ninth embodiments described above. Alternative to the examples, an example in which the magnetic sensor 10 is made using a base material having a columnar shape will be described in the present embodiment.

(a) of FIG. 20 is a diagram illustrating a cross-sectional view of the magnetic sensor 10 according to the present embodiment. (b) of FIG. 20 is a diagram illustrating a perspective view of the magnetic sensor 10 according to the present embodiment.

The magnetic sensor 10 includes a base material 11A, the wiring layer 14, the pinned layer 15, the tunnel layer 16, and the free layers 17a and 17b, as illustrated in (a) and (b) of FIG. 20.

The base material 11A is a member which is made of an electrical insulating material and formed into a columnar shape. The wiring layer 14 is made of a conductive metal material such as Cu or Al and formed on the outer periphery of the base material 11A to have a ring shape in cross section.

The pinned layer 15 is formed on the outer periphery of the wiring layer 14 to have a ring shape in cross section. The pinned layer 15 is a magnetization fixed layer whose magnetization direction is fixed in the circumferential direction centering on the axis of the base material 11A. The tunnel layer 16 is formed on the outer periphery of the pinned layer 15 to have a ring shape in cross section. The free layers 17a and 17b are arranged on the outer peripheral side of the tunnel layer 16. The free layers 17a and 17b are ferromagnetic layers whose magnetization direction follows the outer magnetic field to be changed. That is, the tunnel layer 16 constitutes a non-magnetic intermediate layer which is interposed between the pinned layer 15 and the free layers 17a and 17b and whose resistance value is changed by the angle between the magnetization direction of the pinned layer 15 and the magnetization direction of the free layers 17a and 17b.

In the present embodiment configured in this manner, the TMR element 20 is made of the free layer 17a, the pinned layer 15, and the tunnel layer 16, and the TMR element 21 is made of the free layer 17b, the pinned layer 15, and the tunnel layer 16.

According to the present embodiment described above, the pinned layer 15 has the ring shape on the outer periphery of the wiring layer 14. Therefore, the magnetic field (that is, leaking magnetic field) forms a closed loop (see a solid arrow in (a) of FIG. 20) in the pinned layer 15 in the circumferential direction centering on the axis of the base material 11A. The free layers 17a and 17b are arranged on the outer peripheral side of the pinned layer 15. Therefore, in the similar manner to that of the first embodiment, the influence of the magnetic field leaking from the pinned layer 15 on the free layers 17a and 17b can be restricted.

Thirteenth Embodiment

The example in which the magnetic sensor 10 is made using the base material having the columnar shape has been described in the twelfth embodiment described above. Alternative to the example, an example in which the magnetic sensor 10 is made using a base material having a cylindrical shape will be described in the present embodiment.

(a) of FIG. 21 is a diagram illustrating a cross-sectional view of a magnetic sensor 10 according to the present embodiment, in a state in which a base material 11B of the magnetic sensor 10 according to the present embodiment is not rounded. (b) of FIG. 21 is a diagram illustrating a cross-sectional view of the magnetic sensor 10 in a state in which the base material 11B is rounded.

The base material 11B of the present embodiment is formed into a cylindrical shape. Specifically, a flexible printed substrate is used as the base material 11B.

The magnetic sensor 10 according to the present embodiment is deformed into a cylindrical shape by rounding the layers made by laminating the wiring layer 14, the pinned layer 15, the tunnel layer 16, and the free layers 17a and 17b relative to the flexible printed substrate as the base material 11B, as illustrated in (b) of FIG. 21. Accordingly, the magnetic field forms a closed loop (see a thick arrow in (b) of FIG. 21) in the pinned layer 15 in the circumferential direction centering on the axis of the base material 11B. The free layers 17a and 17b are arranged on the outer peripheral side of the pinned layer 15. Therefore, the influence of the magnetic field leaking from the pinned layer 15 on the free layers 17a and 17b can be restricted in the same manner as that of the twelfth embodiment.

OTHER EMBODIMENTS

The examples in which the contour of the projection portion 13 in cross section has the bent shape on the opposite side of the substrate 11 have been described in the first to fifth embodiments described above. Alternative to the examples, the projection portion 13 may be modified in manners of the following (1), (2), (3), and (4).

(1) In the cross section of the projection portion 13, the contour on the opposite side of the substrate 11 has an arc shape, as illustrated in (a) and (b) of FIG. 22. (a) of FIG. 22 is a diagram illustrating a cross-sectional view of the substrate 11 and the projection portion 13. (b) of FIG. 22 is a diagram illustrating a perspective view of the substrate 11 and the projection portion 13.

(2) The projection portion 13 has a rectangular shape in cross section, as illustrated in (c) and (d) of FIG. 22. (c) FIG. 22 is a diagram illustrating a cross-sectional view of the substrate 11 and the projection portion 13. (d) of FIG. 22 is a diagram illustrating a perspective view of the substrate 11 and the projection portion 13.

(3) The projection portion 13 has a trapezoidal shape in cross section, as illustrated in (a) and (b) of FIG. 23. (a) od FIG. 23 is a diagram illustrating a cross-sectional view of the substrate 11 and the projection portion 13. (b) of FIG. 23 is a diagram illustrating a perspective view of the substrate 11 and the projection portion 13.

(4) The projection portion 13 is formed into a cylindrical shape, as illustrated in (c) of FIG. 23. (c) of FIG. 23 is a diagram illustrating a cross-sectional view of the substrate 11 and the projection portion 13.

The examples of the projections portion 13 provided on the substrate 11 have been described in the first to fifth embodiments described above. Alternative to the examples, the projection portion may be provided by the substrate by forming a projection on the surface 11a of the substrate, as described in the following (5), (6), (7), and (8).

(5) A projection portion having a semicircular shape in cross section is formed by the substrate 11, as illustrated in (a) of FIG. 24.

(6) A projection portion having a square shape in cross section is formed by the substrate 11, as illustrated in (b) of FIG. 24.

(7) A projection portion having a trapezoidal shape in cross section is formed by the substrate 11, as illustrated in (c) of FIG. 24.

(8) A projection portion having a semielliptical shape in cross section is formed by the substrate 11, as illustrated in (d) of FIG. 24.

The example of the substrate 11 formed with the recessed portion 11e having the inner surface with the bent contour in cross section has been described in the eighth embodiment. Alternative to the example, the recessed portion 11e may be formed in the manner of the following (9), (10), (11), and (12).

(9) The recessed portion 11e having a semicircular shape in cross section is formed in the substrate 11, as illustrated in (a) of FIG. 25.

(10) The recessed portion 11e having a rectangular shape in cross section is formed in the substrate 11, as illustrated in (b) of FIG. 25.

(11) The recessed portion 11e having a trapezoidal shape in cross section is formed in the substrate 11, as illustrated in (c) FIG. 25.

(12) The recessed portion 11e having a semielliptical shape in cross section is formed in the substrate 11, as illustrated in (d) of FIG. 25.

The example of the substrate 11 formed with the recessed portion 11e has been described in the eighth embodiment described above. Alternative to the example, a recessed portion 12a may be formed in the insulating layer 12, as illustrated in FIG. 26. In this case, the wiring layer 14 is formed along the inner surface of the recessed portion 12a of the insulating layer 12. In addition, the pinned layer 15 is formed along the wiring layer 14. That is, the pinned layer 15 can be formed along the inner surface of the recessed portion 12a of the insulating layer 12 through the wiring layer 14. In this manner, the pinned layer 15 (15X) can have a bent shape in cross section, in the similar manner to that of the eighth embodiment described above (see FIG. 16).

The examples in which the size of the free layers 17a and 17b in the planar direction P is respectively set to a size smaller than the size of the pinned layer 15 in the planar direction P have been described in the first to seventh embodiments described above. Alternatively, the size of the free layers 17a and 17b in the planar direction P may be respectively set to a size which is the same as the size of the pinned layer 15 in the planar direction P.

The example of the magnetic sensor 10 having two TMR elements 21 has been described in the eighth embodiment described above. Alternatively, the magnetic sensor 10 may have two GMR elements 21.

The examples of the magnetic sensor 10 having the two TMR elements (or two GMR elements) have been described in the first to eleventh embodiments described above. Alternative to the examples, the magnetic sensor 10 may have one TMR element (or one GMR element). Alternatively, the magnetic sensor 10 may have three or more TMR elements (or three or more GMR elements).

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A magnetic sensor comprising:
a magnetization fixed layer disposed adjacent to a surface of a substrate and having a magnetization direction that is fixed in a direction parallel to a planar direction of the substrate;
a ferromagnetic layer disposed on a side opposite to the substrate with respect to the magnetization fixed layer, and having a magnetization direction that changes according to an external magnetic field; and
a non-magnetic intermediate layer interposed between the magnetization fixed layer and the ferromagnetic layer, and having a resistance value that changes according to an angle between the magnetization direction of the magnetization fixed layer and the magnetization direction of the ferromagnetic layer, wherein
an application angle of the external magnetic field is measured based on a resistance value between the magnetization fixed layer and the ferromagnetic layer,
the magnetization fixed layer includes a bent portion having a bent shape in cross section in which a first end portion and a second end portion of a flat portion, which defines a planar direction parallel to the planar direction of the substrate, are respectively bent toward the substrate, and
a magnetic field leaking from the magnetization fixed layer forms a closed loop excluding the ferromagnetic layer to suppress interaction between the ferromagnetic layer and the magnetic field leaking from the magnetization fixed layer.

2. A magnetic sensor comprising:
a magnetization fixed layer disposed adjacent to a surface of a substrate and having a magnetization direction fixed in a direction parallel to a planar direction of the substrate;
a ferromagnetic layer disposed on a side opposite to the substrate with respect to the magnetization fixed layer, and having a magnetization direction that changes according to an external magnetic field; and
a non-magnetic intermediate layer interposed between the magnetization fixed layer and the ferromagnetic layer, and having a resistance value that changes according to an angle between the magnetization direction of the magnetization fixed layer and the magnetization direction of the ferromagnetic layer, wherein
an application angle of the external magnetic field is measured based on a resistance value between the magnetization fixed layer and the ferromagnetic layer,
the magnetization fixed layer includes a bent portion having a bent shape in cross section which projects toward a side opposite to the substrate, and
a magnetic field leaking from the magnetization fixed layer forms a closed loop excluding the ferromagnetic layer to suppress interaction between the ferromagnetic layer and the magnetic field leaking from the magnetization fixed layer.

3. The magnetic sensor according to claim 1, wherein a size of the ferromagnetic layer in the planar direction is set to a same size as a size of the magnetization fixed layer in the planar direction, or to a size smaller than the size of the magnetization fixed layer in the planar direction.

4. The magnetic sensor according to claim 1, wherein the magnetization fixed layer includes:
a laminated ferrimagnetic structure including a first magnetic layer and a second magnetic layer and a non-magnetic layer interposed between the first magnetic layer and the second magnetic layer; and
an antiferromagnetic layer arranged between the substrate and the laminated ferrimagnetic structure.

5. The magnetic sensor according to claim 1, wherein the magnetization fixed layer is made of a material having a coercive force higher than that of the ferromagnetic layer.

6. The magnetic sensor according to claim 1, wherein
a projection portion is disposed on the surface of the substrate, the projection portion having a projected shape in cross section projecting in a plate thickness direction of the substrate, and
the bent portion of the magnetization fixed layer is disposed along the projection portion.

7. The magnetic sensor according to claim 6, wherein
the projection portion includes a first projection layer and a second projection layer, the first projection layer having a projected shape in cross section projecting from the substrate in a direction orthogonal to the planar direction of the substrate, the second projection layer covering the first projection layer on a side opposite to the substrate.

8. The magnetic sensor according to claim 7, wherein the first projection layer is made of an electric insulating material.

9. The magnetic sensor according to claim 7, wherein the second projection layer is made of an electric insulating material.

10. The magnetic sensor according to claim 7, wherein the first projection layer is made of a conductive material.

11. The magnetic sensor according to claim 7, wherein the second projection layer is made of a conductive material.

12. The magnetic sensor according to claim 7, wherein the first projection layer is formed by removing an extra portion other than the first projection layer in a first film molded along the surface of the substrate through etching.

13. The magnetic sensor according to claim 12, wherein the second projection layer is formed by removing an extra portion other than the second projection layer in a second film molded to cover both of the substrate and the first film through etching.

14. The magnetic sensor according to claim 1, wherein a high permeability member that is made of a material having a permeability higher than that of the substrate is disposed between the substrate and the magnetization fixed layer to form a magnetic field path through which a magnetic field leaking from the magnetization fixed layer passes.

15. The magnetic sensor according to claim 1, wherein the magnetization fixed layer, the ferromagnetic layer, and the non-magnetic intermediate layer constitute a Tunneling Magneto Resistance element.

16. The magnetic sensor according to claim 1, wherein the magnetization fixed layer, the ferromagnetic layer, and the non-magnetic intermediate layer constitute a Giant Magneto Resistance element.

17. The magnetic sensor according to claim 2, wherein
a projection portion is disposed on the surface of the substrate, the projection portion having a projected shape in cross section projecting in a plate thickness direction of the substrate, and
the bent portion of the magnetization fixed layer is disposed along the projection portion.

18. The magnetic sensor according to claim 1, wherein
the magnetic field leaking from the magnetization fixed layer extends from the magnetization fixed layer and into the substrate without extending through the ferromagnetic layer.

19. The magnetic sensor according to claim 2, wherein
the magnetic field leaking from the magnetization fixed layer extends from the magnetization fixed layer and into the substrate without extending through the ferromagnetic layer.

* * * * *